United States Patent [19]

Niimura

[11] Patent Number: 5,365,231
[45] Date of Patent: Nov. 15, 1994

[54] ENCODING APPARATUS FOR DIGITAL SIGNAL WITH IMPROVED BLOCK CHANNEL CODING

[75] Inventor: Kazuharu Niimura, Fukaya, Japan

[73] Assignee: Kabushiki Kaisha Toshiba, Kawasaki, Japan

[21] Appl. No.: 858,637

[22] Filed: Mar. 27, 1992

[30] Foreign Application Priority Data

Mar. 30, 1991 [JP] Japan .................. 3-093031
Mar. 30, 1991 [JP] Japan .................. 3-093032
Mar. 30, 1991 [JP] Japan .................. 3-093033

[51] Int. Cl.$^5$ .............................. H03M 7/00
[52] U.S. Cl. ..................... 341/58; 341/106; 341/68
[58] Field of Search .......... 341/58, 68, 95, 106; 375/18-20, 25, 106, 111, 114

[56] References Cited

U.S. PATENT DOCUMENTS

| | | |
|---|---|---|
| 4,531,153 | 7/1985 | Watanabe . |
| 4,775,985 | 10/1988 | Busby ................... 375/25 |
| 4,985,700 | 1/1991 | Mikami . |
| 4,988,999 | 1/1991 | Uehara et al. ............ 341/59 |
| 5,192,949 | 3/1993 | Suzuki et al. ........... 341/58 X |
| 5,196,848 | 3/1993 | Sakazaki ................ 341/58 |
| 5,198,813 | 3/1993 | Isozaki ................. 341/59 |

FOREIGN PATENT DOCUMENTS

| | | |
|---|---|---|
| 0177950 | 4/1986 | European Pat. Off. . |
| 0178813 | 4/1986 | European Pat. Off. . |
| 0351055 | 1/1990 | European Pat. Off. . |
| 0392506 | 10/1990 | European Pat. Off. . |
| 58-75950 | 5/1983 | Japan . |
| 60-124148 | 7/1985 | Japan . |

Primary Examiner—Sharon D. Logan
Attorney, Agent, or Firm—Cushman, Darby & Cushman

[57] ABSTRACT

An encoder separates an input digital signal including m bits into the first group and the second group, and encodes each piece of data in the first group to a single code word including n bits in one-to-one correspondence and encodes each piece of data in the second group to two code words each including n bits in one-to-two correspondence. A CDS calculator calculates a CDS value for each of the words output from the encoder. A DSV calculator calculates the accumulated DSV value of the individual words output from the encoder. When the two-n-bit code words are output from the encoder, a code selector selects that one of the code words which decreases the next accumulated DSV value to be calculated by the DSV calculator, according to the CDS value from the CDS calculator and the accumulated DSV value from the DSV calculator. A margin bit generator generates a predetermined margin bit which decreases the next accumulated DSV value to be calculated by the DSV calculator, according to the CDS value from the CDS calculator and the accumulated DSV value from the DSV calculator, and inserts the margin bit in the single n-bit code word output from the encoder and the one code word selected by the code selector. A transfer section transfers the resulting n+1 bits.

10 Claims, 26 Drawing Sheets

| NUMBER OF CODES | INPUT DATA | P1 | P2 | P3 | P4 | P5 | P6 | P7 | P8 | P9 | P10 | P11 | P12 | P1 | P2 | P3 | P4 | P5 | P6 | P7 | P8 | P9 | P10 | P11 | P12 |
|---|---|---|---|---|---|---|---|---|---|---|---|---|---|---|---|---|---|---|---|---|---|---|---|---|---|
| 27×2 | 255 ~ 229 | 1 | 0 | | | | | | | | 0 | 1 | | 1 | 0 | | | | | | | | 0 | 1 | |
| 88×2 | 228 ~ 141 | 1 | 0 | | | | | | | | | 0 | | 0 | | | | | | | | | 0 | 1 | |
| 141 | 140 ~ 0 | 0 | | | | | | | | | | | | 0 | | | | | | | | | | | |

| CODES P1P2---P11P12 | NUMBER OF CHANGE POINTS | CDS VALUE OF CODE | | | | | | | | | | | | NUMBER OF CODES |
|---|---|---|---|---|---|---|---|---|---|---|---|---|---|---|
| | | -12 | -10 | -8 | -6 | -4 | -2 | 0 | +2 | +4 | +6 | +8 | +10 | +12 | |
| 0□0 TOTAL NUMBER OF CODES (144) 141 | 0 | | | | | | | | | | | | (1) | | 1 |
| | 1 | | (1) | 1 | 1 | 1 | 1 | 1 | 1 | 1 | 1 | (1) | | | 10 |
| | 2 | | | | 1 | 2 | 3 | 4 | 5 | 6 | 7 | 8 | | | 36 |
| | 3 | | | | 6 | 10 | 12 | 12 | 10 | 6 | | | | | 56 |
| | 4 | | | | | | 4 | 9 | 12 | 10 | | | | | 35 |
| | 5 | | | | | | | 3 | 3 | | | | | | 6 |
| 0□01 TOTAL NUMBER OF CODES (89) 88 | 1 | | | | | | | | | | | | (1) | | 1 |
| | 2 | | | 1 | 1 | 1 | 1 | 1 | 1 | 1 | 1 | | | | 9 |
| | 3 | | | | 1 | 2 | 3 | 4 | 5 | 6 | 7 | | | | 28 |
| | 4 | | | | | 5 | 8 | 9 | 8 | 5 | | | | | 35 |
| | 5 | | | | | | 3 | 6 | 6 | | | | | | 15 |
| | 6 | | | | | | | 1 | | | | | | | 1 |
| 10□0 TOTAL NUMBER OF CODES (89) 88 | 1 | (1) | | | | | | | | | | | | | 1 |
| | 2 | | | 1 | 1 | 1 | 1 | 1 | 1 | 1 | 1 | 1 | | | 9 |
| | 3 | | | 7 | 6 | 5 | 4 | 3 | 2 | 1 | | | | | 28 |
| | 4 | | | | | 5 | 8 | 9 | 8 | 5 | | | | | 35 |
| | 5 | | | | | 6 | 6 | 3 | | | | | | | 15 |
| | 6 | | | | | | | 1 | | | | | | | 1 |
| 10□01 TOTAL NUMBER OF CODES 55 | 2 | | 1 | | | | | | | | | | | | 1 |
| | 3 | | | 1 | 1 | 1 | 1 | 1 | 1 | 1 | 1 | | | | 8 |
| | 4 | | | | 6 | 5 | 4 | 3 | 2 | 1 | | | | | 21 |
| | 5 | | | | | 4 | 6 | 6 | 4 | | | | | | 20 |
| | 6 | | | | | | 3 | 2 | | | | | | | 5 |
| | | 1 | 2 | 11 | 24 | 48 | 71 | 79 | 66 | 44 | 18 | 11 | 1 | 1 | |

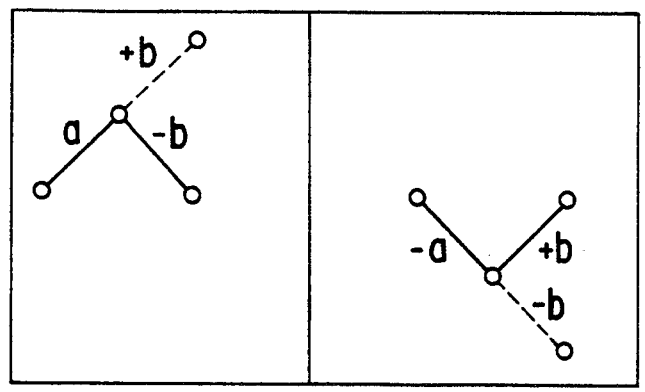
FIG. 7A
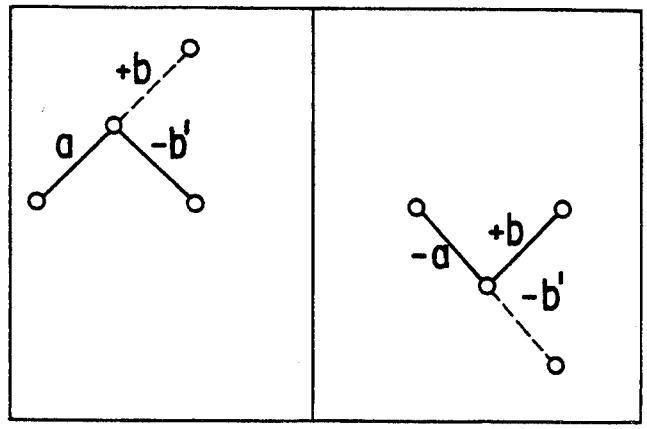
FIG. 7B
FIG. 8

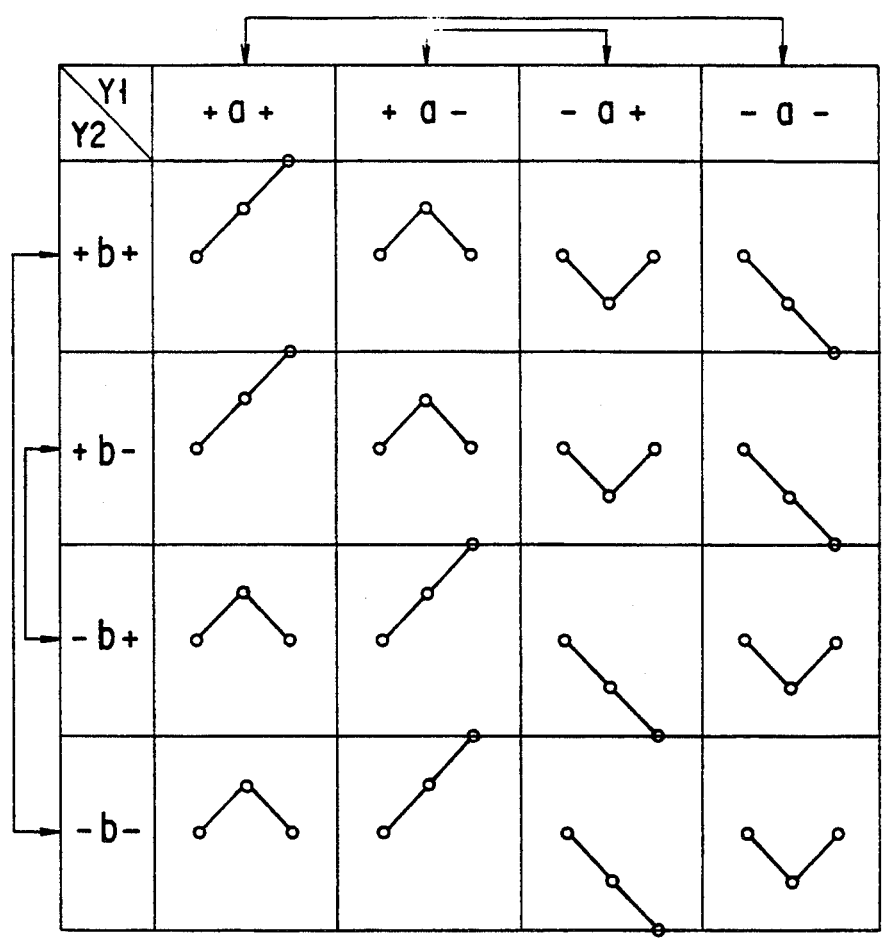
F I G. 9

| INPUT DATA | | CODES BASED ON NRZI RULE (CODES AT TERMINAL 30) | | | | | | | | | | | | | | | | | | | | | | |
|---|---|---|---|---|---|---|---|---|---|---|---|---|---|---|---|---|---|---|---|---|---|---|---|---|
| Y1 | Y2 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
| 0 | 255 | 0 | 0 | 0 | 0 | 0 | 0 | 0 | 0 | 0 | 0 | 0 | 0 | 1 | 0 | 0 | 0 | 0 | 0 | 0 | 0 | 1 | 0 | |
| 10 | 245 | 0 | 0 | 1 | 0 | 0 | 0 | 0 | 0 | 0 | 1 | 0 | 0 | 0 | 0 | 0 | 0 | 0 | 0 | 0 | 0 | 0 | 0 | 0 |
| 40 | 215 | 0 | 0 | 0 | 0 | 0 | 0 | 0 | 0 | 1 | 0 | 0 | 0 | 0 | 0 | 0 | 0 | 0 | 1 | 0 | 0 | 0 | 0 | 0 |
| 75 | 180 | 0 | 0 | 0 | 0 | 0 | 1 | 0 | 0 | 0 | 0 | 0 | 0 | 0 | 0 | 0 | 1 | 0 | 0 | 0 | 0 | 0 | 0 | 0 |
| 100 | 160 | 0 | 0 | 0 | 0 | 1 | 0 | 0 | 0 | 0 | 0 | 0 | 0 | 0 | 0 | 1 | 0 | 0 | 0 | 0 | 0 | 0 | 0 | 0 |
| 127 | 127 | 0 | 0 | 0 | 0 | 0 | 0 | 1 | 0 | 0 | 0 | 0 | 0 | 0 | 0 | 0 | 0 | 0 | 1 | 0 | 0 | 0 | 0 | |
| 160 | 100 | 0 | 0 | 0 | 0 | 0 | 0 | 0 | 1 | 0 | 0 | 0 | 0 | 0 | 0 | 0 | 0 | 0 | 0 | 0 | 0 | 1 | 0 | 0 |
| 180 | 75 | 0 | 0 | 0 | 0 | 0 | 1 | 0 | 0 | 0 | 0 | 0 | 0 | 0 | 0 | 0 | 0 | 0 | 0 | 0 | 1 | 0 | 0 | 0 |
| 215 | 40 | 0 | 0 | 0 | 0 | 0 | 0 | 1 | 0 | 0 | 0 | 0 | 0 | 0 | 0 | 0 | 0 | 0 | 0 | 0 | 0 | 0 | 1 | 0 |
| 245 | 10 | 0 | 0 | 0 | 0 | 0 | 1 | 0 | 0 | 0 | 0 | 0 | 0 | 0 | 0 | 0 | 0 | 0 | 0 | 0 | 0 | 0 | 1 | 0 |
| 255 | 0 | 0 | 0 | 0 | 1 | 0 | 0 | 0 | 0 | 0 | 0 | 0 | 0 | 0 | 0 | 0 | 0 | 0 | 0 | 0 | 1 | 0 | 0 | 0 |
| 0 | 0 | 0 | 0 | 0 | 1 | 0 | 0 | 0 | 0 | 0 | 0 | 0 | 0 | 0 | 0 | 0 | 1 | 0 | 0 | 0 | 0 | 0 | 0 | 0 |
| 255 | 255 | 0 | 0 | 0 | 0 | 0 | 0 | 0 | 0 | 1 | 0 | 0 | 0 | 0 | 0 | 0 | 0 | 0 | 0 | 0 | 0 | 1 | 0 | 0 |
| NOT USED | | 0 | 0 | 0 | 0 | 0 | 0 | 0 | 0 | 0 | 0 | 0 | 0 | 1 | 0 | 0 | 0 | 0 | 0 | 1 | 0 | 0 | 0 | 0 |
| NOT USED | | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 |
| NOT USED | | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |

F I G. 14A

| CODES AFTER NRZI MODULATION (CODES AT TERMINAL 31) | | | | | | | | | | | | | | | | | | | | | | | CDS | POSITIONS IN FIG.2A |
|---|---|---|---|---|---|---|---|---|---|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | | |
| 1 | 1 | 1 | 1 | 1 | 1 | 1 | 1 | 1 | 1 | 1 | 1 | 1 | 0 | 0 | 0 | 0 | 0 | 0 | 0 | 0 | 1 | 1 | 8 | ⓐ |
| 1 | 1 | 0 | 0 | 0 | 0 | 0 | 0 | 0 | 1 | 1 | 1 | 1 | 1 | 1 | 1 | 1 | 1 | 1 | 1 | 1 | 1 | 1 | 8 | ⓑ |
| 1 | 1 | 1 | 1 | 1 | 1 | 1 | 1 | 0 | 0 | 0 | 0 | 0 | 0 | 0 | 0 | 0 | 1 | 1 | 1 | 1 | 1 | 1 | 6 | ⓒ |
| 1 | 1 | 1 | 1 | 1 | 0 | 0 | 0 | 0 | 0 | 0 | 0 | 0 | 0 | 0 | 0 | 1 | 1 | 1 | 1 | 1 | 1 | 1 | 4 | ⓓ |
| 1 | 1 | 1 | 1 | 0 | 0 | 0 | 0 | 0 | 0 | 0 | 0 | 0 | 0 | 0 | 1 | 1 | 1 | 1 | 1 | 1 | 1 | 1 | 2 | ⓔ |
| 1 | 1 | 1 | 1 | 1 | 1 | 0 | 0 | 0 | 0 | 0 | 0 | 0 | 0 | 0 | 0 | 0 | 0 | 1 | 1 | 1 | 1 | 1 | 0 | ⓕ |
| 1 | 1 | 1 | 1 | 1 | 1 | 1 | 0 | 0 | 0 | 0 | 0 | 0 | 0 | 0 | 0 | 0 | 0 | 0 | 0 | 0 | 1 | 1 | -2 | ⓖ |
| 1 | 1 | 1 | 1 | 1 | 0 | 0 | 0 | 0 | 0 | 0 | 0 | 0 | 0 | 0 | 0 | 0 | 0 | 0 | 0 | 1 | 1 | 1 | -4 | ⓗ |
| 1 | 1 | 1 | 1 | 1 | 1 | 0 | 0 | 0 | 0 | 0 | 0 | 0 | 0 | 0 | 0 | 0 | 0 | 0 | 0 | 0 | 1 | 1 | -6 | ⓘ |
| 1 | 1 | 1 | 1 | 1 | 0 | 0 | 0 | 0 | 0 | 0 | 0 | 0 | 0 | 0 | 0 | 0 | 0 | 0 | 0 | 0 | 1 | 1 | -8 | ⓙ |
| 1 | 1 | 1 | 0 | 0 | 0 | 0 | 0 | 0 | 0 | 0 | 0 | 0 | 0 | 0 | 0 | 0 | 0 | 0 | 0 | 1 | 1 | 1 | -8 | ⓚ |
| 1 | 1 | 1 | 0 | 0 | 0 | 0 | 0 | 0 | 0 | 0 | 0 | 0 | 0 | 0 | 0 | 1 | 1 | 1 | 1 | 1 | 1 | 1 | 0 | ⓛ |
| 1 | 1 | 1 | 1 | 1 | 1 | 1 | 1 | 0 | 0 | 0 | 0 | 0 | 0 | 0 | 0 | 0 | 0 | 0 | 0 | 1 | 1 | 1 | 0 | ⓜ |
| 1 | 1 | 1 | 1 | 1 | 1 | 1 | 1 | 1 | 1 | 1 | 1 | 0 | 0 | 0 | 0 | 0 | 0 | 1 | 1 | 1 | 1 | 1 | 10 | |
| 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 18 | |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | -24 | |

F I G. 14B

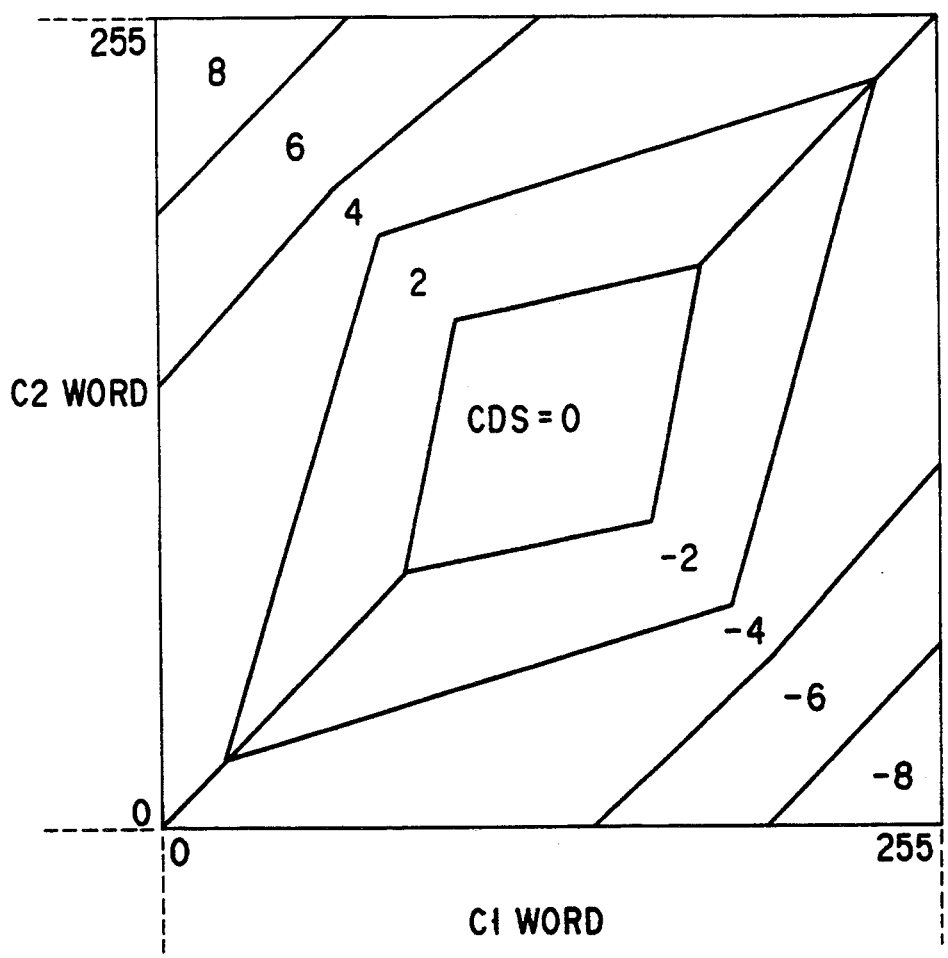
F I G. 16

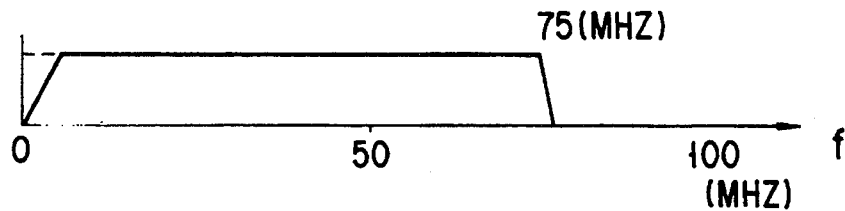
FIG. 17A
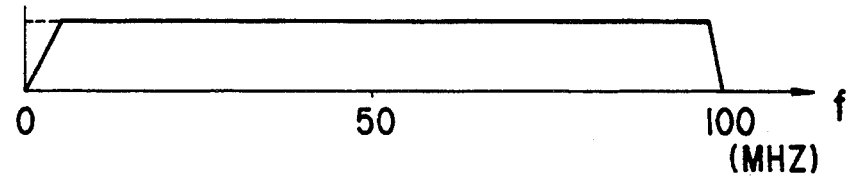
PRIOR ART
FIG. 17B
| NUMBER OF CHANGE POINTS | NUMBER OF CODE WORDS |
|---|---|
| 0 | 1 |
| 1 | 23 |
| 2 | 231 |
| 3 | 1330 |
| 4 | 4845 |
| 5 | 11628 |
| 6 | 18564 |
| 7 | 19448 |
| 8 | 12870 |
| 9 | 5005 |
| 10 | 1001 |
| 11 | 79 |
| 12 | 1 |
FIG. 18

SPECTRUM WITH DUTY RATIO OF 50%

| INPUT DATA | | CODES BASED ON NRZI RULE |
|---|---|---|
| Y1 | Y2 | 1 2 3 4 5 6 7 8 9 10 11 12 13 14 15 16 17 18 19 20 21 22 23 |
| 10 | 245 | 1 0 0 0 0 0 0 0 0 0 0 0 0 0 0 0 0 0 0 0 0 0 0 |
| 45 | 210 | 1 0 0 0 0 0 0 0 0 0 0 0 1 0 0 0 0 0 0 0 0 0 0 |
| 75 | 180 | 1 0 0 0 0 0 0 0 1 0 0 0 0 0 0 0 1 0 0 0 0 0 0 |
| 110 | 145 | 1 0 0 0 0 0 1 0 0 0 0 0 1 0 0 0 0 0 1 0 0 0 0 |
| 145 | 110 | 1 0 0 0 1 0 0 0 1 0 0 0 1 0 0 0 1 0 0 0 1 0 0 |
| 195 | 60 | 1 0 0 1 0 0 1 0 0 1 0 0 1 0 0 1 0 0 1 0 0 1 0 |
| 245 | 10 | 1 0 1 0 1 0 1 0 1 0 1 0 1 0 1 0 1 0 1 0 1 0 1 |
| ¦ | ¦ | |
| ¦ | ¦ | |
| ¦ | ¦ | |
| ¦ | ¦ | |
| ¦ | ¦ | |
| ¦ | ¦ | |
| | | |
| | | |
| | | |

F I G. 24A

| CODES AFTER NRZI MODULATION<br>1 2 3 4 5 6 7 8 9 10 11 12 13 14 15 16 17 18 19 20 21 22 23 | SPECTRUM OF CODE | POSITION IN FIG.19 |
|---|---|---|
| 0 0 0 0 0 0 0 0 0 0 0 0 0 0 0 0 0 0 0 0 0 0 0 | (1) IN FIG.20 | (1) |
| 0 0 0 0 0 0 0 0 0 0 0 0 1 1 1 1 1 1 1 1 1 1 1 | (2) IN FIG.20 | (2) |
| 0 0 0 0 0 0 0 0 1 1 1 1 1 1 1 1 0 0 0 0 0 0 0 | (3) IN FIG.20 | (3) |
| 0 0 0 0 0 0 1 1 1 1 1 1 0 0 0 0 0 0 1 1 1 1 1 | (4) IN FIG.20 | (4) |
| 0 0 0 0 1 1 1 1 0 0 0 0 1 1 1 1 0 0 0 0 1 1 1 | (6) IN FIG.20 | (6) |
| 0 0 0 1 1 1 0 0 0 1 1 1 0 0 0 1 1 1 0 0 0 1 1 | (8) IN FIG.20 | (8) |
| 0 0 1 1 0 0 1 1 0 0 1 1 0 0 1 1 0 0 1 1 0 0 1 | (12) IN FIG.20 | (12) |

F I G. 24B

ENCODING APPARATUS FOR DIGITAL SIGNAL WITH IMPROVED BLOCK CHANNEL CODING

Background of the Invention

1. Field of the Invention

The present invention relates to an encoding apparatus, and, more particularly, to an encoding apparatus with improved block channel coding, which is used to convert a digital signal, such as a video signal, into a code word, and record or reproduce the code word.

2. Description of the Related Art

There have been developed apparatuses which sample a signal having an approximation correlation, such as a color video signal of a high definition television (HDTV) system, to covert it to digital data of m bits per sample, e.g., 8 bits (one word), and then record that data on a video tape recorder (VTR) for later reproduction.

If 8-bit data is recorded as it is by such an apparatus, "1" and "0", binary levels of the record signal at that time, do not appear evenly, so that the record signal is likely to include a DC component. Because the magnetic head of an ordinary recording/reproducing apparatus cannot reproduce the DC component before the reproduction, the record signal is subjected to an encoding process including block channel coding so as not to include the DC component.

The block channel coding included in the encoding process at the time of such recording should be carried out so as to make the DSV (Digital Sum Variation) value of the record signal as small as possible. The "DSV" is a value acquired by integrating a binary level "1" or "0" in association with "+1" or "−1" respectively, and has a value at an arbitrary point of time or in an arbitrary period of time. In the case where a DSV for successive binary signals is acquired from the beginning, the record signal has a DC component if the DSV increases or decreases infinitely, while the record signal has no DC component if the DSV is finite.

FIG. 27 is a block diagram showing a conventional magnetic recording/reproducing apparatus which digitalizes a color video signal as explained above, and records the digital signal on a VTR or reproduces the recorded signal therefrom, as disclosed in Published Unexamined Japanese Application No. 58-75950. A video signal input from an input terminal 1 is converted into an 8-bit parallel digital signal by an A/D converter 2, and this digital signal is then sent to a DSV control encoding circuit 103. The encoding circuit 103 replaces the input digital signal with an associated one of 8-bit words prepared by rearranging the aforementioned individual 8-bit data words according to a predetermined rule.

In this case the words to be replaced with are stored in, for example, a read only memory (ROM), so that the target word to replace the input data is read out from the ROM by specifying the address with the corresponding natural binary code, resulting in replacement of the input data with the read-out word. The words replaced in the D/A converter 103 are input to an inversion processing circuit 104, which in turn changes the input words to complementary words, for example, word by word.

In the inversion processing circuit 104, a certain word is directly output, and one word following that word is changed to a word with inverted "1" and "0". For instance, if data word (DSVCC), "00110001," having a CDS (Code word Digital Sum) value of −2 is inverted, it is converted into "11001110." The CDS value of this data word is +2. In other words, a complementary word to the word input from the encoding circuit 103 is such that the positive or negative polarity of its CDS value is opposite to that of the original word. In this manner the word as input and the inverted word are alternately output from the inversion processing circuit 104. As an input color video signal has a high correlation, it is easily understood that the DSV values of output data words of the inversion processing circuit 104, if computed, will converge to "0." The words from the inversion processing circuit 104 are supplied to a parallel/serial converter 105 to be converted into serial data. That is, the 8-bit parallel data is converted into serial data which is then supplied to a VTR section 11. In this VTR section 11 one-field data of the color video signal is recorded on a tape as a plurality of tracks.

It is to be noted that the "CDS value" mentioned above is the value of the sum of code data of one word, considering that "1" and "0" of the code data are "+1" and "−1," respectively, and is called a weight of a code. The DSV value is therefore an accumulated value of the CDS values.

Thereafter, the tape having data recorded by the VTR section 11 in the above manner is played, and the reproduced data is converted into 8-bit parallel data by a serial/parallel converter 107. This parallel data is then input, word by word, to a reverse inversion processing circuit 108. The reverse inversion processing circuit 108 subjects the input word to the opposite process to the one executed in the inversion processing circuit 104 at the recording time, to restore the complementary word at the recording time to the original word. The restored original word from the reverse inversion processing circuit 108 is input to a DSV control decoding circuit 109. This decoding circuit 109 subjects the input word to the completely opposite processing as done by the encoding circuit 103 of the recording system, thereby restoring the input word to the original digital data. In this respect the DSV control decoding circuit 109 has a RAM, and the word acquired by this circuit 109 becomes the original natural binary code. This natural binary code is input to a D/A converter 50. The D/A converter 50 converts the input digital data to an analog color video signal which is sent to an output terminal 60.

Problems inherent to the above conventional signal processing system will be discussed below referring to FIGS. 23A to 23D. In general magnetic signal recording/reproduction, a reproduced signal has a frequency response as shown in FIG. 23A. This characteristic shows the output amplitude characteristic of a reproduced signal with a flat noise distribution. The feature of this characteristic will be discussed below. Referring to the diagram, the low frequency component indicated by the arrow A has a low C/N (carrier to noise) ratio due to the differential characteristic of the magnetic head. The intermediate frequency component indicated by the arrow B has a good C/N ratio; of this component, the component having a low frequency has a higher C/N ratio than the one having a higher frequency. The high frequency component indicated by the arrow C has a low C/N ratio due to losses of a magnetic tape and the magnetic head. The error rate for a signal having a spectrum shown in FIG. 23B is sent onto a transfer path including the above-described magnetic recording and reproduction has a relation ⓐ, ⓓ>ⓒ,ⓑ. Therefore, concentrating the spectrum on the portion having a good C/N ratio can reduce the error rate to ensure high density recording. In the conventional magnetic recording/reproducing apparatus as shown in FIG. 27, however, the signal that is recorded and reproduced has many spectrum components around ⓐ and ⓓ or concentrated more on ⓒ than on ⓑ. This means that the best use of the capacity of the transfer path (specifically, the magnetic tape, magnetic head, etc.) is not always made. When the signal to be recorded is image data having a correlation, the conventional magnetic recording/reproducing apparatus as shown in FIG. 27 can suppress the low frequency component of the record signal or the reproduced signal. The spectrum of the record signal does not however match the characteristic of the transfer path, which means that the portion of the transfer path with a good C/N ratio is not effectively used, thus degrading the image quality accordingly.

In other words, the conventional magnetic recording/reproducing apparatus, which converts an analog video signal into a digital signal and encodes the digital signal before recording it on a VTR or reproducing it therefrom, has the first shortcoming such that because the spectrum of the record signal does not match the characteristic of the transfer path, the portion of the transfer path with a good C/N ratio cannot effectively be used, thus degrading the image quality at the recording/reproducing time accordingly.

The above conventional signal processing system has the following shortcoming. The band of codes which are electrically transferred in the above-described signal processing system is broad, ranging from a low frequency range to a high frequency range. Given that the minimum magnetism inversion time is denoted by Tmin and the data clock period by T, Tmin/T is defined as a density ratio DR. In the above prior art, this DR is 1 and the record signal often includes a high frequency component, necessitating the use of that portion where the magnetic head does not have a good characteristic. This increases the error rate at the recording/reproducing time, degrading the quality of the image signal at the recording/reproducing time.

That is, the conventional magnetic recording/reproducing apparatus, which converts an analog video signal into a digital signal and encodes the digital signal before recording it on a VTR or reproducing it therefrom, has the second shortcoming such that because of the density ratio DR being "1," the record signal tends to include many high frequency components, broadening the band on the high frequency side of the signal that is to be recorded on or reproduced from a VTR. This increases the error rate at the recording/reproducing time, degrading the quality of the image signal at the recording/reproducing time.

The above conventional signal processing system also has the following shortcoming. Since the band of codes which are electrically transferred in the above-described signal processing system is broad, ranging from a low frequency range to a high frequency range, when a video signal has a successive variation, the DSV value diverges so that the record signal contains a considerable amount of DC components and low-frequency energy. This requires the use of that portion where the magnetic head does not have a good characteristic, thus increasing the error rate at the recording/reproducing time. In addition, even when the video signal has no variation and has the same level, inversion is carried out word by word, thus increasing the maximum magnetism inversion time Tmax. This increases the amount of DC components of the record signal and the low-frequency energy, also increasing the error rate at the recording/reproducing time. Further, since the minimum magnetism inversion time Tmin is the same as the data clock period T as mentioned above, the density ratio DR becomes "1," the record signal often contains a DC component and it becomes necessary to use that portion where the magnetic head does not have a good characteristic. The error rate at the recording/reproducing time will also increase in this respect. In short, the conventional magnetic recording/reproducing apparatus has the third shortcoming such that because the signal to be recorded on the VRT 11 has a broad band, the quality of the image signal at the recording/reproducing time is deteriorated.

The conventional magnetic recording/reproducing apparatus, which converts an analog video signal into a digital signal and encodes the digital signal before recording it on a VTR or reproducing it therefrom, therefore has the fourth shortcoming such that the DSV value diverges or the maximum magnetism inversion time Tmax is large, so that the record signal contains a considerable amount of DC components and low-frequency energy. This increases the error rate at the reproducing time, deteriorating the image quality. Further, because the density ratio DR is "1," the record signal tends to include many high frequency components, increasing the error rate at the recording/reproducing time. This further degrades the image quality.

SUMMARY OF THE INVENTION

It is therefore an object of the present invention to provide a new and advanced encoding apparatus for a digital signal with improved block channel coding in which the DSV value is finite and made small, so that, when used particularly in a magnetic recording/reproducing apparatus, this apparatus can contribute to improving the image quality at the recording/reproducing time by setting the maximum magnetism inversion time small and increasing the density ratio.

It is another object of the present invention to provide an encoding apparatus which can suppress the high frequency component of a record signal/reproduce signal by increasing the density ratio, so that when used particularly in a magnetic recording/reproducing apparatus, it can contribute to improving the image quality at the recording/reproducing time.

It is a further object of the present invention to provide an encoding apparatus which can permit the spectrum of an encoded image signal to concentrate on that portion of a transfer path having a good C/N ratio, so that when used particularly in a magnetic recording/reproducing apparatus, it can significantly improve the error rate at the recording/reproducing time, thus contributing to improvement of the image quality at the recording/reproducing time.

According to a first aspect of the present invention, there is provided an encoding apparatus comprising:

encoding means for separating an input digital signal including m bits (m: a positive integer) into a first group and a second group predetermined with respect to $2^m$ pieces of data allowable for the input digital signal, and encoding each piece of data in the first group to a single code word including n bits (n being a positive integer and larger than m) in one-to-one correspondence and encoding each piece of data in the second group to two code words each including n bits in one-to-two correspondence;

CDS (Code word Digital Sum) calculating means for calculating a CDS value for each of the words output from the encoding means;

DSV (Digital Sum Variation) calculating means for calculating an accumulated DSV value of the individual words output from the encoding means;

code selecting means for, when the two-n-bit code words are output from the encoding means, selecting that one of the code words which decreases a next accumulated DSV value to be calculated by the DSV calculating means, in accordance with the CDS value from the CDS calculating means and the accumulated DSV value from the DSV calculating means;

margin bit inserting means for generating a predetermined margin bit which decreases a next accumulated DSV value to be calculated by the DSV calculating means, in accordance with the CDS value from the CDS calculating means and the accumulated DSV value from the DSV calculating means, and inserting the margin bit in the single n-bit code word output from the encoding means and the one code word selected by the code selecting means; and transfer means for transferring an encoded code word including a total of n+1 bits resulting from the insertion of the predetermined margin bit by the margin bit inserting means.

According to a second aspect of the present invention, there is provided an encoding apparatus comprising:

encoding means for encoding an input digital video signal including m bits (m: a positive integer) per word to a code word including n bits with the number of consecutive bits of a same binary value after NRZI-modulating, being defined to be 2 or greater for every i words (i being a positive integer equal to or greater than 2) having a mutual correlation (n being an integer and n>m*i), in one-to-one correspondence, the encoding means classifying in advance the input video signal into a plurality of regions according to a CDS (Cord word Digital Sum) value of each of $2^{m*i}$ pieces of data allowable for the n-bit code word and assigning that signal of the code word corresponding to the i-word digital signal which has a small variation per word to that region whose absolute value of the CDS value is small to execute encoding;

margin bit inserting means for inserting a predetermined margin bit in the n-bit code word output from the encoding means; and transfer means for transferring an encoded code word including a total of n+1 bits resulting from the insertion of the predetermined margin bit by the margin bit inserting means.

According to a third aspect of the present invention, there is provided an encoding apparatus for encoding an input digital video signal including m bits (m being a positive integer) per word to a predetermined serial data and transferring the code word to a predetermined transfer path, comprising:

encoding means for encoding the digital video signal including m bits per word to a code word including n bits with the number of consecutive bits of a same binary value being defined to be 2 or greater for every i words (i being a positive integer equal to or greater than 2) having a mutual correlation (n being a positive integer and n>m*i), in one-to-one correspondence, the encoding means classifying in advance the input digital video signal into a plurality of regions according to a product of a spectrum of each of $2^{m*i}$ pieces of data allowable for the n-bit code word and a C/N (carrier-to-noise) ratio and assigning that signal of the code word corresponding to the i-word digital signal which has a small variation per word to that region for which a product of the spectrum and the C/N ratio is large to execute encoding; and transfer means for transferring on the predetermined transfer path an encoded code word encoded by the encoding means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is an encoding diagram showing the correlation between input data and a code word in a mapping converter shown in FIG. 1;

FIG. 4 is a diagram showing the CDS value and the number of change points of a code word produced in the encoding apparatus shown in FIG. 1;

FIGS. 7A and 7B are diagrams for explaining an operation for controlling the DSV value by the encoding apparatus in FIG. 1;

FIG. 8 is a diagram for explaining another operation for controlling the DSV value by the encoding apparatus in FIG. 1;

FIG. 9 is a diagram for explaining further operation for controlling the DSV value by the encoding apparatus in FIG. 1;

FIGS. 14A and 14B are tables showing the relation using the specific values between the input data encoded according to the encoding table in FIG. 13 and a code word;

FIG. 16 is an encoding diagram showing the correlation between input data (color signal) and code words in the mapping converter shown in FIG. 11;

Figure 11:
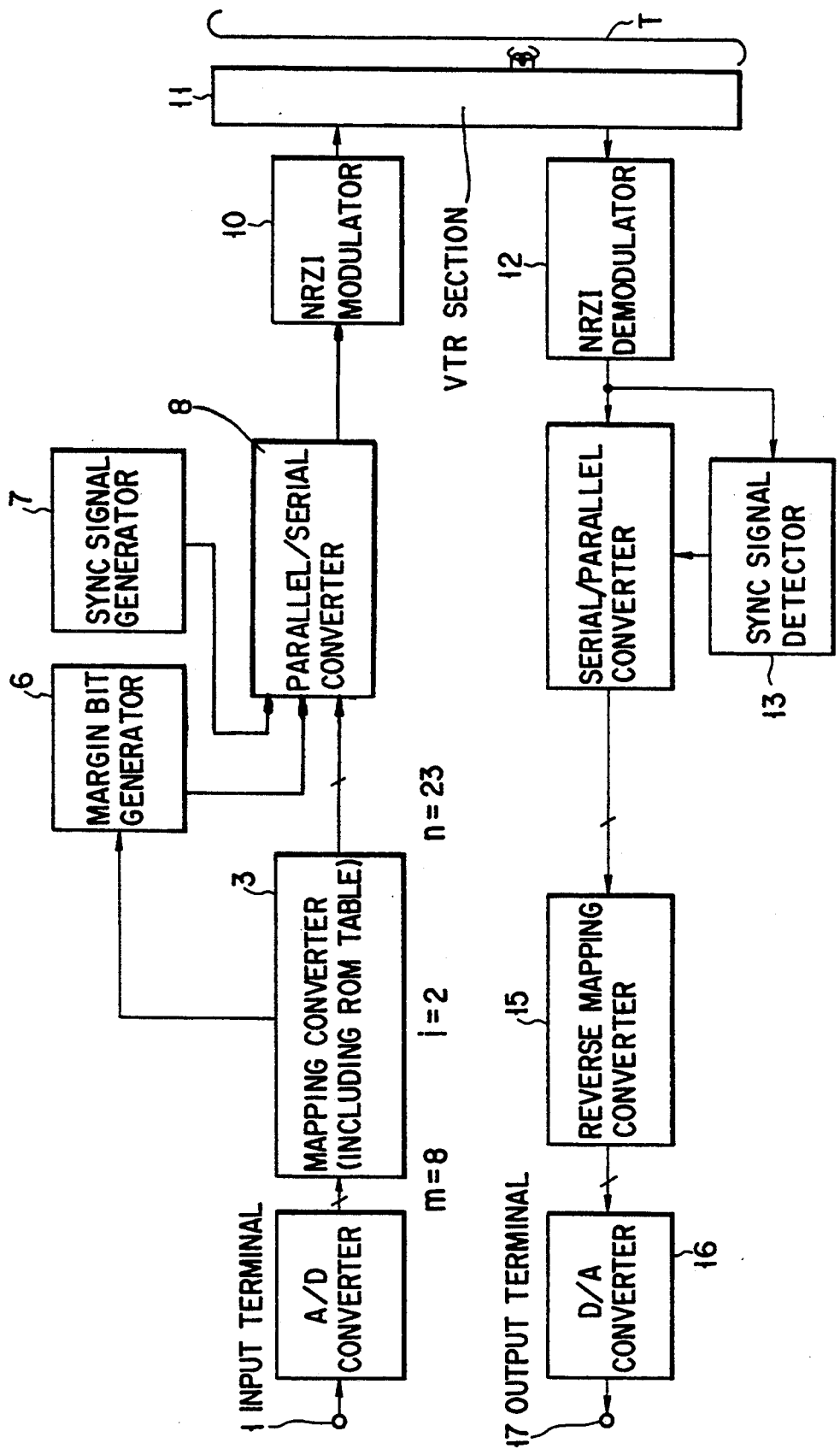
FIG. 11 is a block diagram illustrating the second embodiment of the encoding apparatus according to the present invention.
Figure 19:
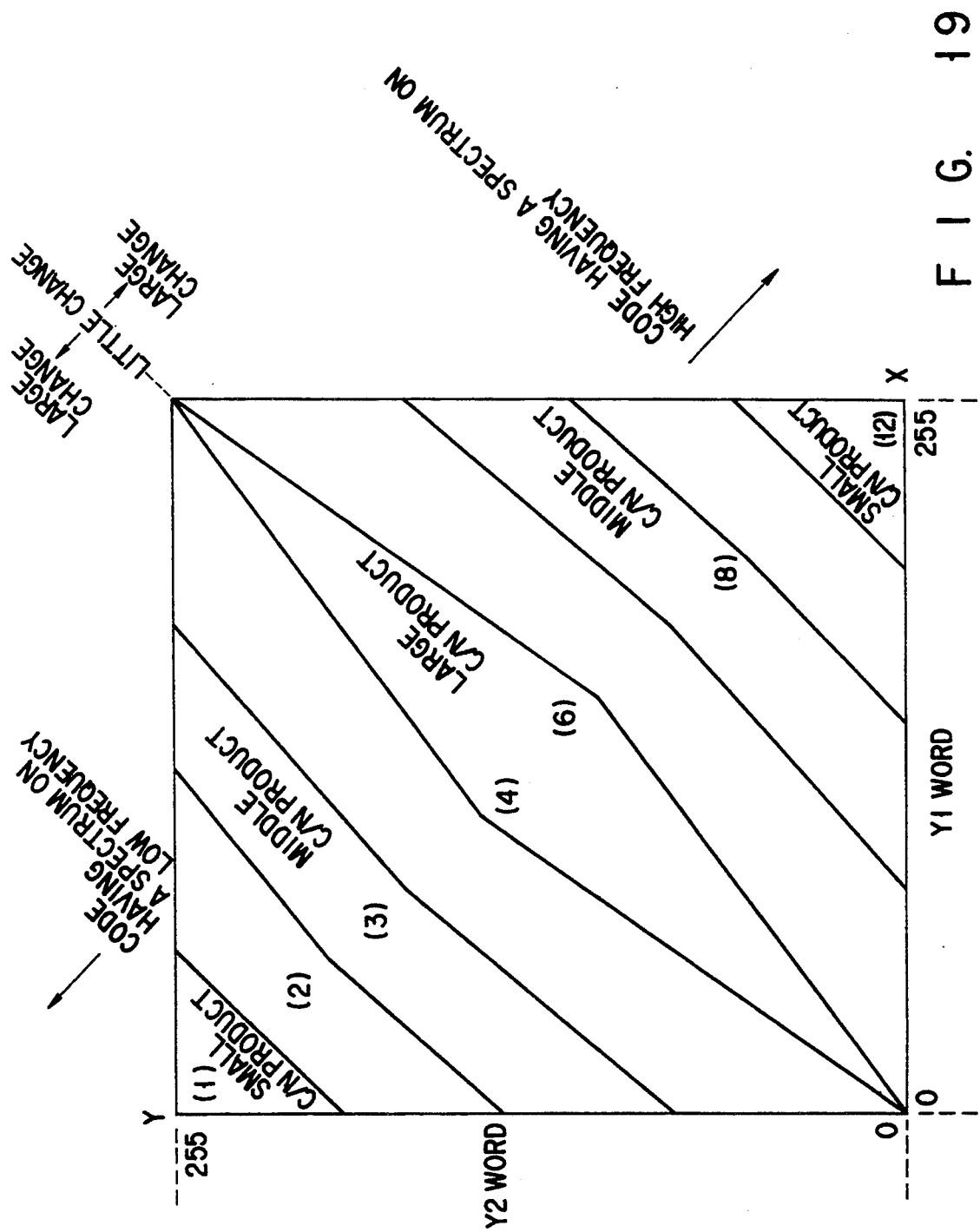
Figure 20:
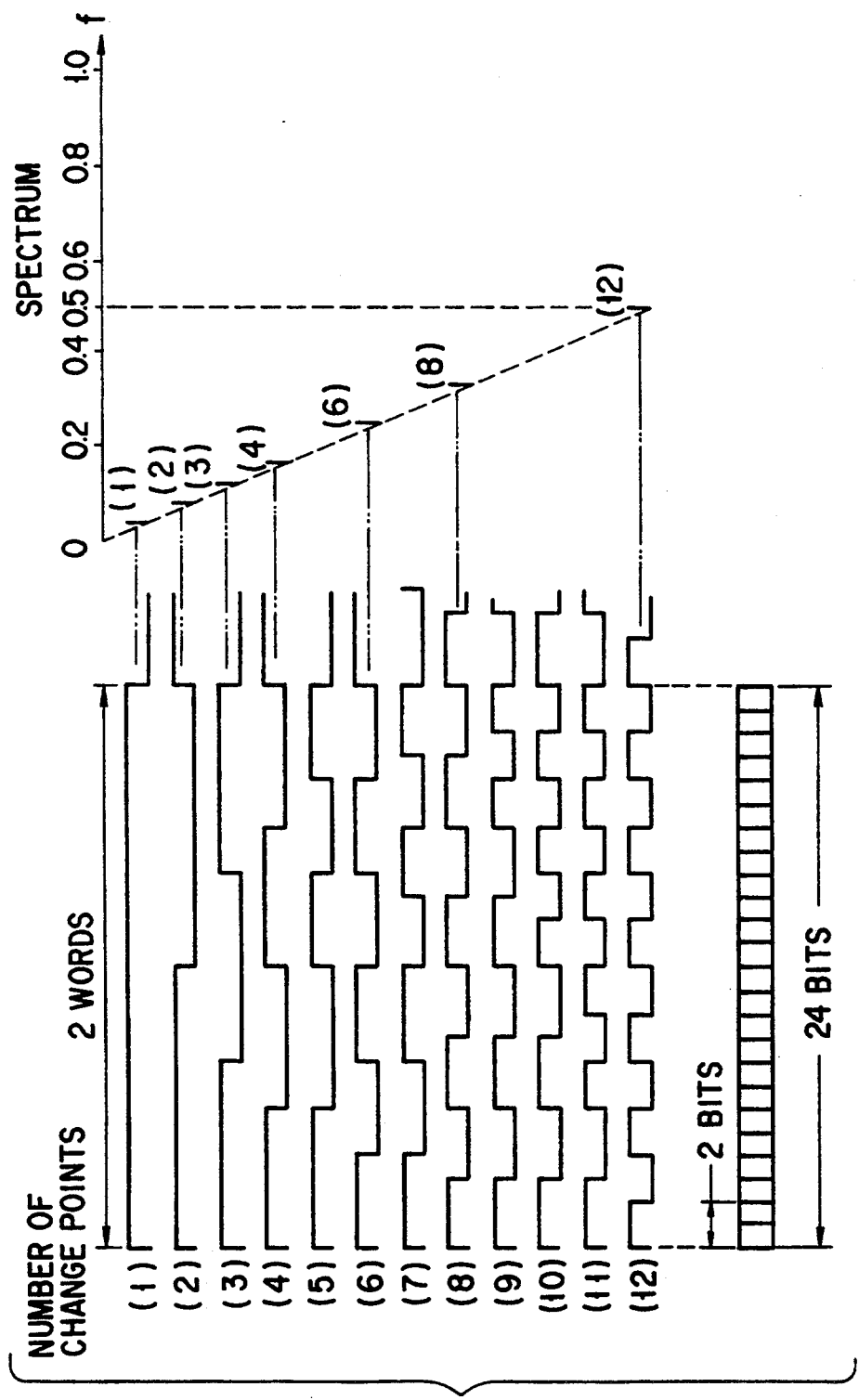
Figure 21:
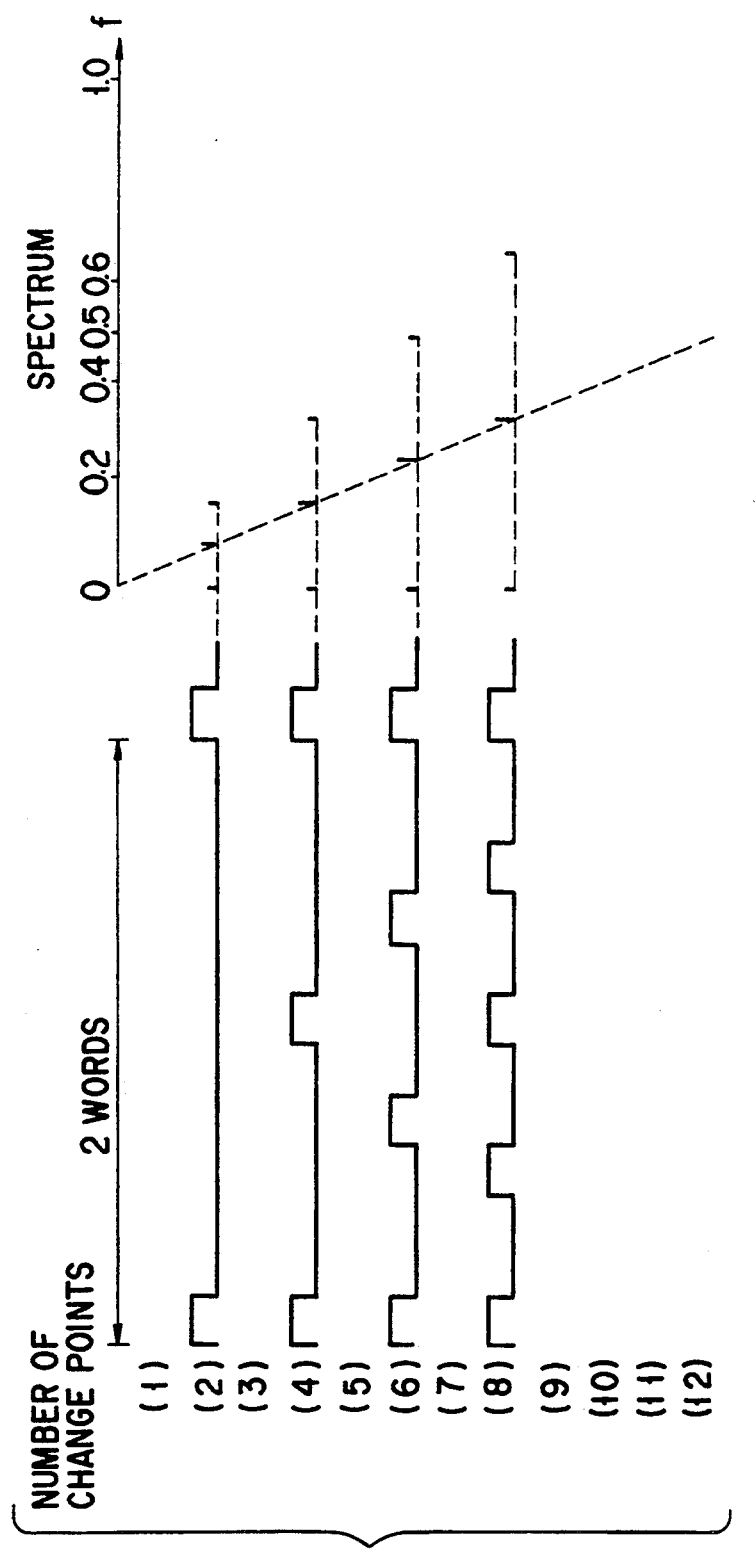
Figure 22:
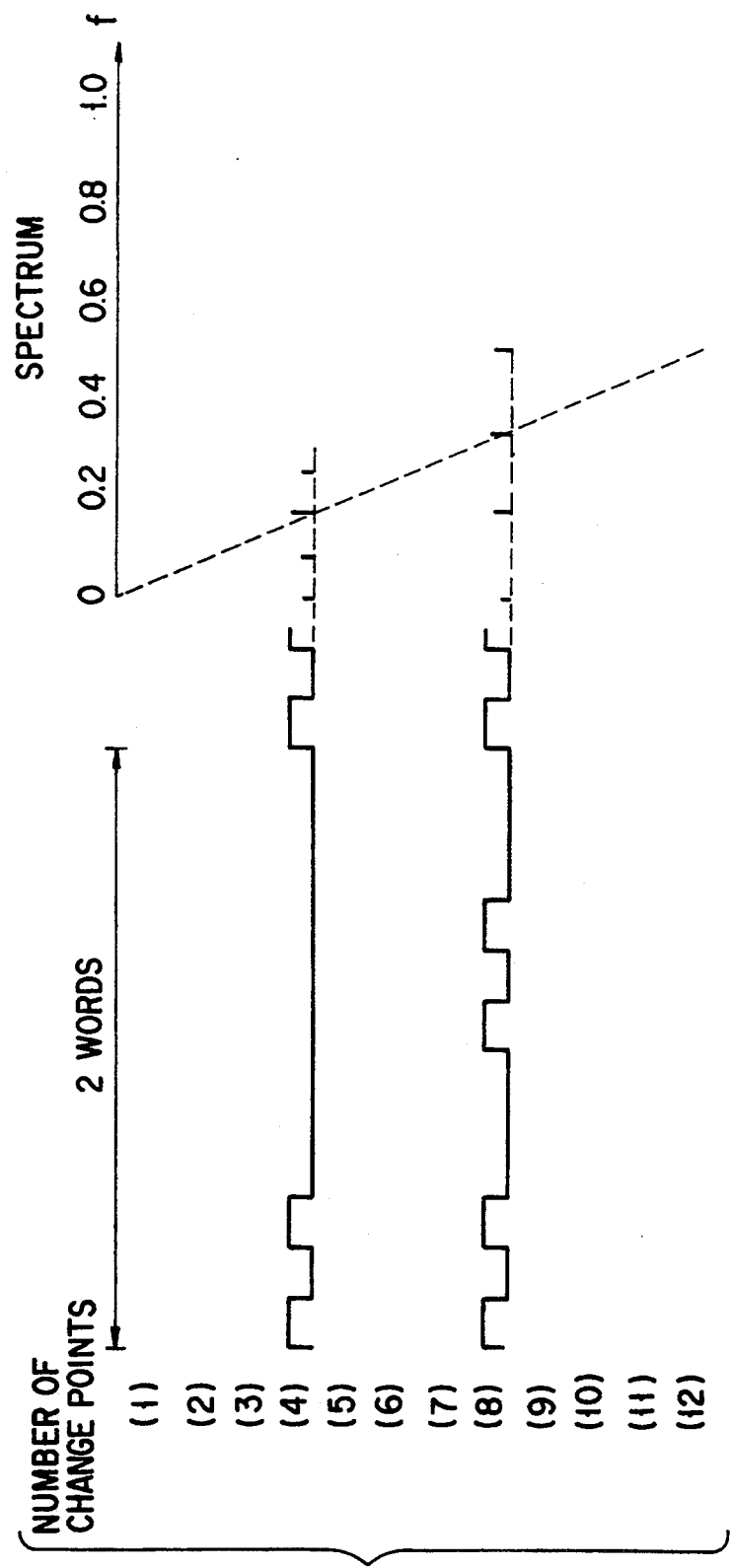
Figure 25:
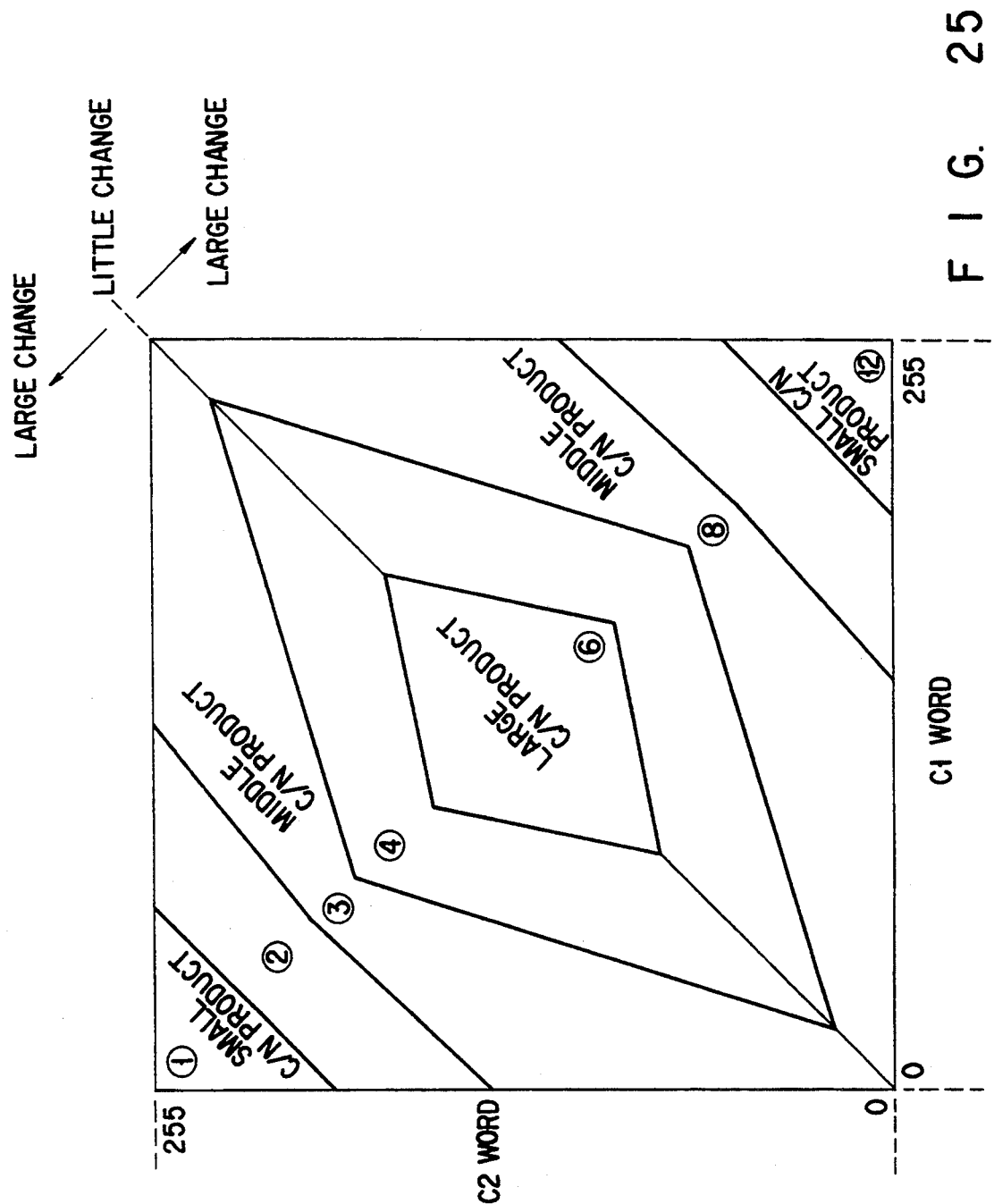
Figure 26A:
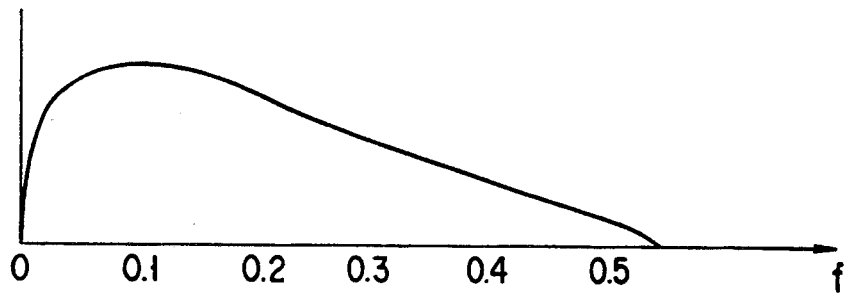
Figure 26B:
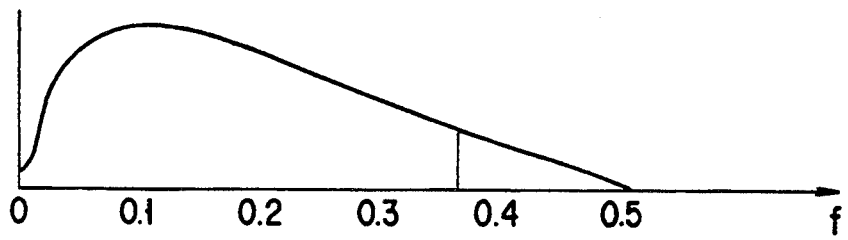
Figure 26C:
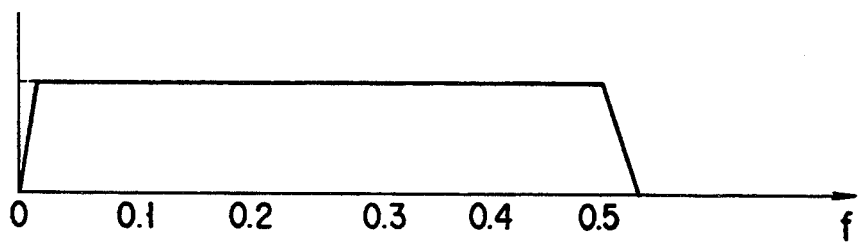
Figure 26D:
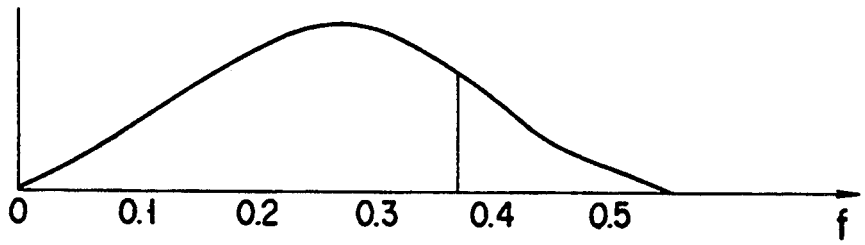
Figure 27:
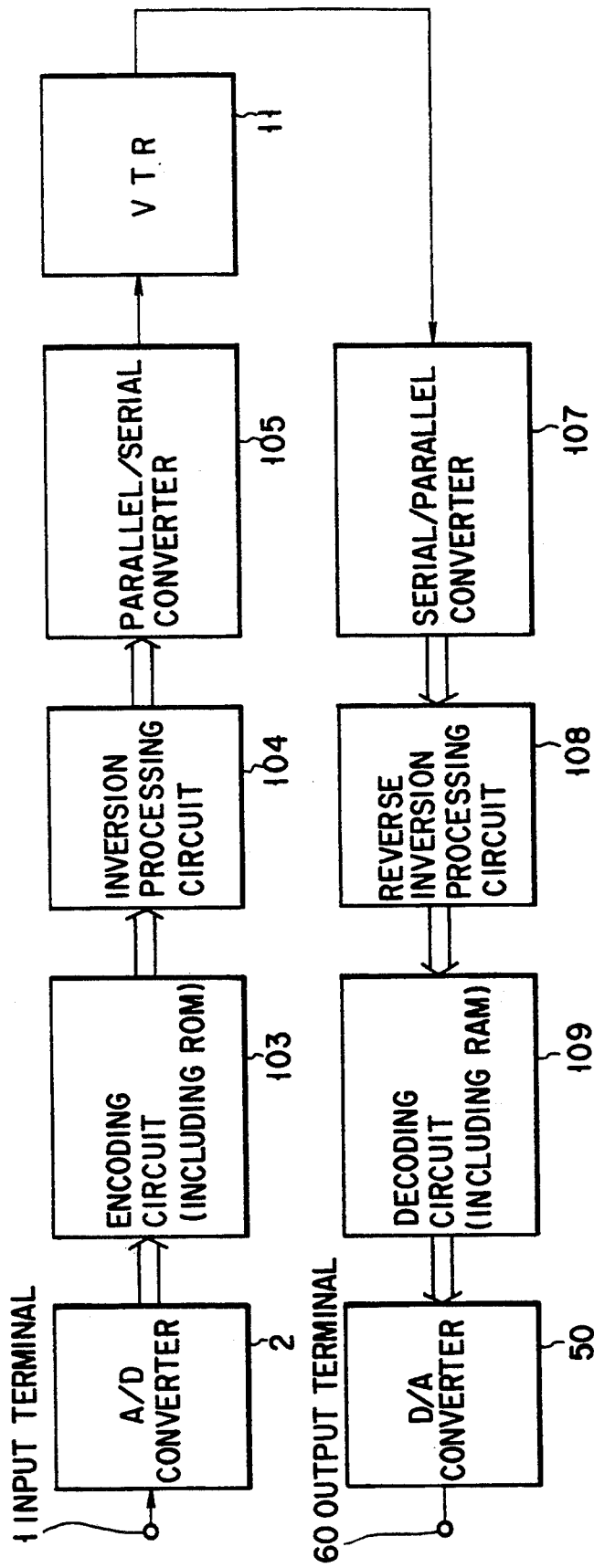

Figs, 17A and 17B are diagrams showing the frequency bands of a record signal and reproduced signal in the encoding apparatus in FIG. 11 in comparison with the conventional bands;

FIG. 18 is a table showing the relation between the number of change points in a code word encoded by the mapping converter in the third embodiment and the number of code words having the respective change points:

FIG. 19 is an encoding diagram illustrating the correlation between input data (luminance signal) and code words in the mapping converter according to the third embodiment;

FIG. 20 is a diagram showing the classification of the relation between code words with a duty ratio of 50% and the spectra of these code words by the number of change points;

FIG. 21 is a diagram showing the classification of the relation between code words with a duty ratio other than 50% and the spectra of these code words by the number of change points;

FIG. 22 another diagram showing the classification of the relation between code words with a duty ratio other than 50% and the spectra of these code words by the number of change points;

FIGS. 23A to 23D are graphs for explaining the meaning of the product of the spectrum of the code and C/N;

FIGS. 24A and 24B are tables showing the relation using the specific values between the input data encoded according to the encoding table in FIG. 19 and a code word;

FIG. 25 is an encoding diagram illustrating the correlation between input data (color signal) and code words in the mapping converter according to the third embodiment;

FIGS. 26A to 26D are graphs showing the characteristic of a transfer path in a VTR section according to the third embodiment and the spectrum distribution characteristic of code words according to the present invention and that of prior art; and FIG. 27 is a block diagram exemplifying a conventional digital magnetic recording/reproducing apparatus.

DETAILED DESCRIPTION OF THE PREFERRED EMBODIMENTS

Reference will now be made in detail to the presently preferred embodiments of the invention as illustrated in the accompanying drawings, in which like reference characters designate like or corresponding parts throughout the several drawings.

Figure 1:
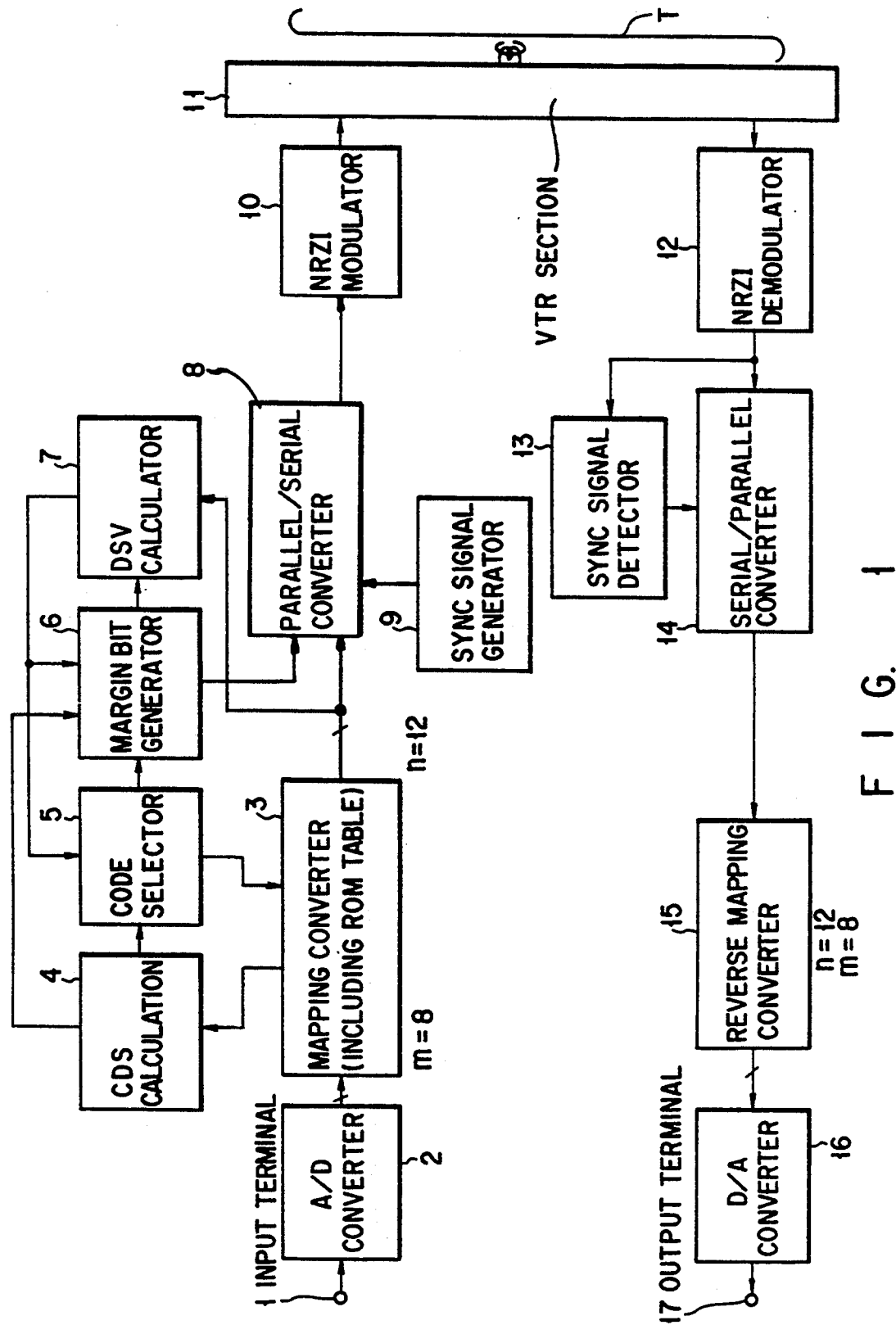
FIG. 1 is a block diagram illustrating the first embodiment of an encoding apparatus according to the present invention.

The first embodiment of the present invention will now be explained referring to the accompanying drawings. FIG. 1 is a block diagram illustrating the embodiment of the present invention as applied to a magnetic recording/reproducing apparatus. Reference numeral "1" denotes an input terminal from which an analog record signal such as a video signal of an HDTV system is input. An A/D converter 2 converts the input analog video signal into an 8-bit digital signal. A mapping converter 3 assigns the input digital signal to two groups of 12-bit code words, one group in one-to-one correspondence and the other in one-to-two correspondence, before encoding. A CDS calculator 4 calculates CDS values of all the words coded by the mapping converter 3. A code selector 5 selects a code word to be output after being coded by the mapping converter 3 at the one-to-two relation. A margin bit generator 6 generates a margin bit in a direction to reduce DSV value of the code word sent from the mapping converter 3 or a fixed margin bit. A DSV calculator 7 calculates the accumulated DSV values of code words sent from the mapping converter 3. A parallel/serial converter 8 performs parallel/serial conversion in such a way that the code word from the mapping converter 3 is converted into a serial signal and a margin bit output from the margin bit generator 6 is inserted into the input code word to perform a parallel/serial conversion. A sync signal generator 9 generates a sync signal by which the parallel/serial converter 8 is activated. An NRZI (Non-Return to Zero Inversion) modulator 10 performs NRZI modulation on the serial signal sent from the parallel/serial modulator 7. A VTR section 11 records a record signal input from the NRZI modulator 10 on a magnetic tape T. A NRZI demodulator 12 performs NRZI demodulation on a signal reproduced by the VTR section 11. A sync signal detector 13 detects a sync signal from the demodulated reproduced signal and supplies the sync signal to a serial/parallel converter 14. The serial/parallel converter 14 converts the input serial signal into a parallel signal based on the sync signal. A reverse mapping converter 15 performs reverse mapping on the code word output from the serial/parallel converter 14, and converts that word into a normal digital signal. A D/A converter 16 converts a digital signal into an analog signal. Reference numeral "17" denotes an output terminal where a reproduced analog video signal is output. The mapping converter 3 and the reverse mapping converter 15 perform their conversions in the totally opposite processes.

The operation of this embodiment will now be described. The A/D converter 2 converts a color video signal from the input terminal 1 into a digital signal of 8 bits per pixel. The mapping converter 3 encodes an input digital signal to a 12-bit word. The minimum number of "0s" between the codes "1," which indicate change points based on an NRZI rule and correspond to magnetism inversion, is one. 12-bit code data coded by the mapping converter 3 is regarded as one word.

Figure 2:
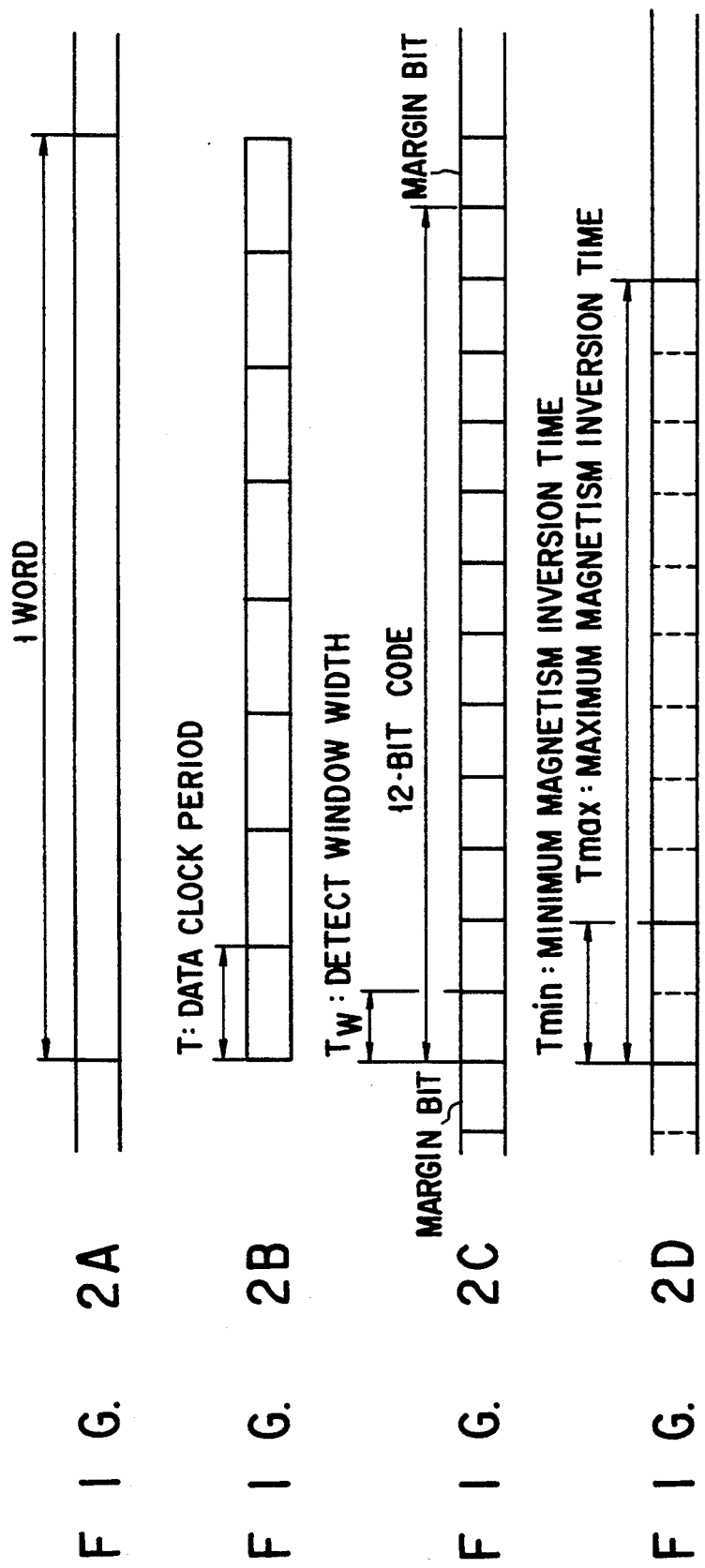
FIGS. 2A to 2D are diagrams exemplifying the structures of signals processed in the encoding apparatus shown in FIG. 1.

The color video signal input from the input terminal 1 is converted into an 8-bit digital signal by the A/D converter 2 as shown in FIGS. 2A and 2B, and is sent to the mapping converter 3. By means of, for example, a ROM (table) to be described later, the mapping converter 3 assigns the received 8-bit digital signal to two groups of 12-bit code words in one-to-one correspondence and one-to-two correspondence as shown in FIG. 2C before encoding. The CDS calculator 4 calculates the CDS values of all the code words coded by the mapping converter 3 by, for example, the ROM (table), and sends the calculation result to the code selector 5 and the margin bit generator 6. The DSV calculator 7 calculates the DSV values of all code words from the mapping converter 3 by means of, for example, an adder, and supplies the calculation result to the code selector 5 and the margin bit generator 6. It is supposed that the DSV calculator 7 internally performs NRZI modulation on the input code word, and calculate the modulated DSV value. The mapping converter 3 produces one code word in one-to-one correspondence and two code words in one-to-two correspondence with respect to the input digital signal. For a single code word, the mapping converter 3 sends that code word to the parallel/serial converter 8 and the DSV calculator 7. The margin bit generator 6 determines a margin bit ("1" or "0") to be inserted into the code word output from the mapping converter 3. To describe more specifically, the margin bit generator 6 receives the CDS value of the code word, sent from the mapping converter 3, from the CDS calculator 4 and the accumulated DSV value from the DSV calculator 7. The margin bit generator 6 then generates a margin bit and sends it to the parallel/serial converter 8 so that a margin bit in the direction of reducing the DSV value calculated by the DSV calculator 7 is inserted after the rear end of the code word output from the mapping converter 3. The parallel/serial converter 8 converts the code word received from the mapping converter 3 into a serial signal, and inserts the margin bit produced from the margin bit generator 6 to the serial signal as shown in FIG. 2C, sending the acquired signal of 13 bits in total to the NRZI modulator 10. Given that one bit unit shown in FIG. 2C is a detect window width Tw, the minimum magnetism inversion time Tmin is 2Tw (<2 data clocks (T)). The maximum magnetism inversion time Tmax is 8 data clocks (8 T) or shorter.

When the mapping converter 3 produces two code words from the input digital signal, the code selector 5 receives the CDS values of the two code words from the CDS calculator 4 and the DSV values up to now from the DSV calculator 7. The code selector 5 determines which code word is output when the following DSV value calculated by the DSV calculator 7 is reduced, and selects a code word whose DSV value becomes smaller and sends it to the parallel/serial converter 8. The parallel/serial converter 8 converts the received code word into a serial signal, and sends that signal to the NRZI modulator 10. The VTR section 11 records a modulation signal (same as the record signal), sent from the NRZI modulator 10, on the magnetic tape T. In this case, one margin bit, which is generated from the margin bit generator 6, is inserted into the serial signal in the parallel/serial converter 8. The record signal therefore has 13 bits. Although not explained above, an error correction signal, etc. are of course added by a circuit (not shown) to the record signal recorded on the magnetic tape T in the VTR section 11.

A signal reproduced by the VTR section 11, after being demodulated by the NRZI demodulator 12, is sent to the serial/parallel converter 14 and the sync signal detector 13. The sync signal detector 13 detects a sync signal from an input signal, and supplies the sync signal to the serial/parallel converter 14. Upon reception of the sync signal, the serial/parallel converter 14 specifies the position of the code, and converts the input reproduced serial signal into a parallel signal. The word reproduced in this manner is input to the reverse mapping converter 15. The reverse mapping converter 15 performs reverse conversion on the received code word into a normal 8-bit digital data, and outputs this data to the D/A converter 16. The D/A converter 16 converts the received digital signal into an analog video signal, and sends this video signal to the output terminal 17. The specific operations of the individual components in this embodiment shown in FIG. 1 will now be described in order. First, the coding system of the mapping converter 3 will be explained referring to FIG. 3. In FIG. 3, the first column on the left side shows the number of codes to be used for coding input data, and the second column shows input data. The third column presents code words corresponding to the input data. In this embodiment, 8-bit input data "0" to "140" out of those "0" to "255" are coded in one-to-one correspondence and the code words have $P1=P12=0$. Input data "141" to "228" correspond to two code words; one code word has $P1=1$ and $P2=P12=0$, and the other has $P1=P11=0$, and $P12=1$. The remaining input data "229" to "255" correspond to two code word; one code word has $P1=P12=1$, and $P2=P11=0$, and the other also has $P1=P12=1$, and $P2=P11=0$.

As shown in FIG. 3, $P1=P12=0$ is assigned to the code word in one-to-one correspondence with input data. Accordingly, 144 pieces of code data can be obtained at the maximum as shown in the corresponding portion in FIG. 4. Considering the maximum number of continuations of the same bit in a code, however, 141 pieces of code data are used instead of 144 pieces in parentheses in FIG. 4. The table in FIG. 4 will be now explained. The first column on the left side shows types of code data and total number of codes, and the second column shows the number of change points in code data. The third column shows how many pieces of code data corresponding to the CDS values of the code data are present, and the fourth column shows the number of codes for each case. For example, it is indicated that there are two code words each of which has $P1=P12=0$ and has two change points with the CDS value of "−4."

In FIG. 3, $P1=1$ and $P2=P12=0$, $P1=P11=0$ and $P12=1$, or $P1=P12=1$ and $P2=P11=0$ is assigned to the code words in two-to-one correspondence with input data. The code words in this case are also acquired as shown in the corresponding portions in FIG. 4. As described above, data input to the mapping converter 3 is assigned to two groups of code words in one-to-one correspondence and in one-to-two correspondence as shown in FIG. 3 before being coded, and the values of the individual code words are determined in advance. The mapping converter 3 can therefore be designed by storing the correspondence between the data and the code words as shown in FIG. 3 in the ROM (table).

The reason for assigning data to two groups of code words in one-to-one correspondence and in one-to-two correspondence before coding is to control the DSV value to be described later by the optimal number of bits. A supplemental description will be given of input data encoded to two code words by the mapping converter 3. The absolute values of the two code words are expressed by a and @, respectively. The positive CDS values are indicated as +a, and the negative ones are as −a. Further, the CDS values of the code words with the even number of change points are represented as a+, and those with the odd number of change points are as a−. In this embodiment, therefore, the combinations of two code words corresponding to one piece of input data is determined as (1)+a—, —@+(2)+a+, —@—. These combinations are optimal for controlling the DSV value, but other combinations are also available. FIG. 4 shows the examples of combinations (1) and (2). "+a—" in (1) corresponds to the code word, in the case of P1=P11=0 and P12=1, which has the CDS value of "+6" and the three change points. "—@+" in (1) corresponds to the code word, in the case of P1=1 and P2=P12=0, which has the CDS value of "—4" and four change points. "+a+" in (2) corresponds to the code word, in the case of P1=P11=0 and P12=1, which has the CDS value of "+4" and four change points. "—@—" in (2) corresponds to the code word having P1=1 and P2=P12=0, which has the CDS value of "—6" and three change points. In this embodiment, only code word with P1=P12=0 has one-to-one correspondence with input data. It is however possible that code words with P1=1 and P2=P12=0, or P1=P11=0 and P12=1 can have one-to-one correspondence with the input data. The margin bit will be "1" or "0" for code word with P1=P12=0.

Figure 5:
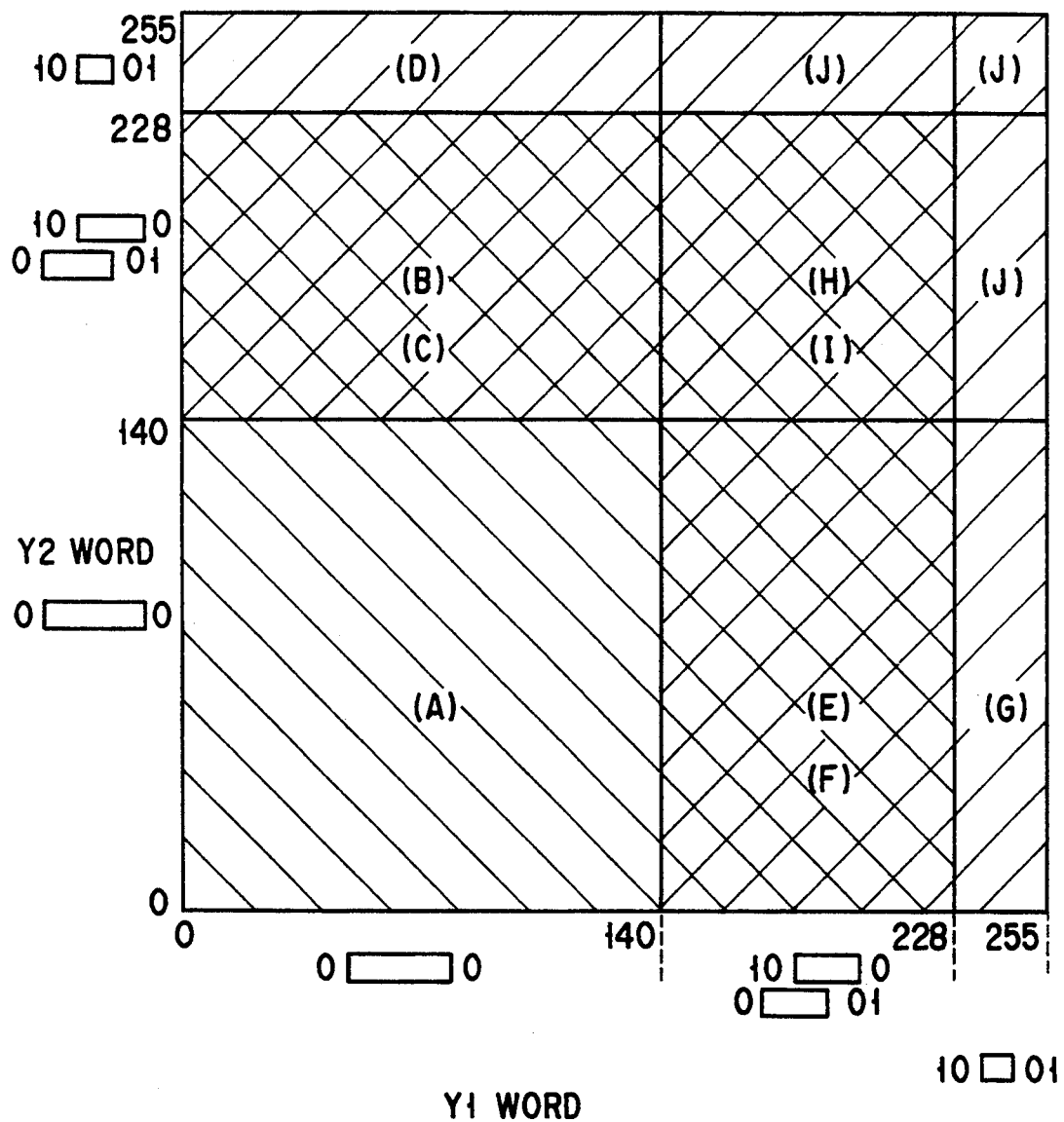
FIG. 5 is a diagram illustrating the patterns of combining two pairs of code words used in the encoding apparatus in FIG. 1.

FIG. 5 is a diagram for explaining a method for determining a margin bit by the margin bit generator 6 in the case where two code words output from the mapping converter 3 continue. The lowest portion in the diagram shows a $Y_1$ word, and the left side portion indicates a $Y_2$ word. The $Y_1$ and $Y_2$ words, classified by coding types, define matrix regions. The margin bit can be "1" or "0," in a shaded region A. By selecting the margin bit "1" or "0," the DSV value calculated by the DSV calculator 7 can be controlled in the direction of reduction. The margin bit is fixed to "0" in shaded regions D, G and J. By the code selector 5 selecting the even number or odd number of change points of the code word in the individual region, it is possible to control the DSV value of the DSV calculator 7 in the reduction direction. Further, in double-shaded regions, B and C, E and F, and H and I, if one of the two code words and a margin bit is selected, the DSV value can be controlled in the reduction direction.

Figure 6:
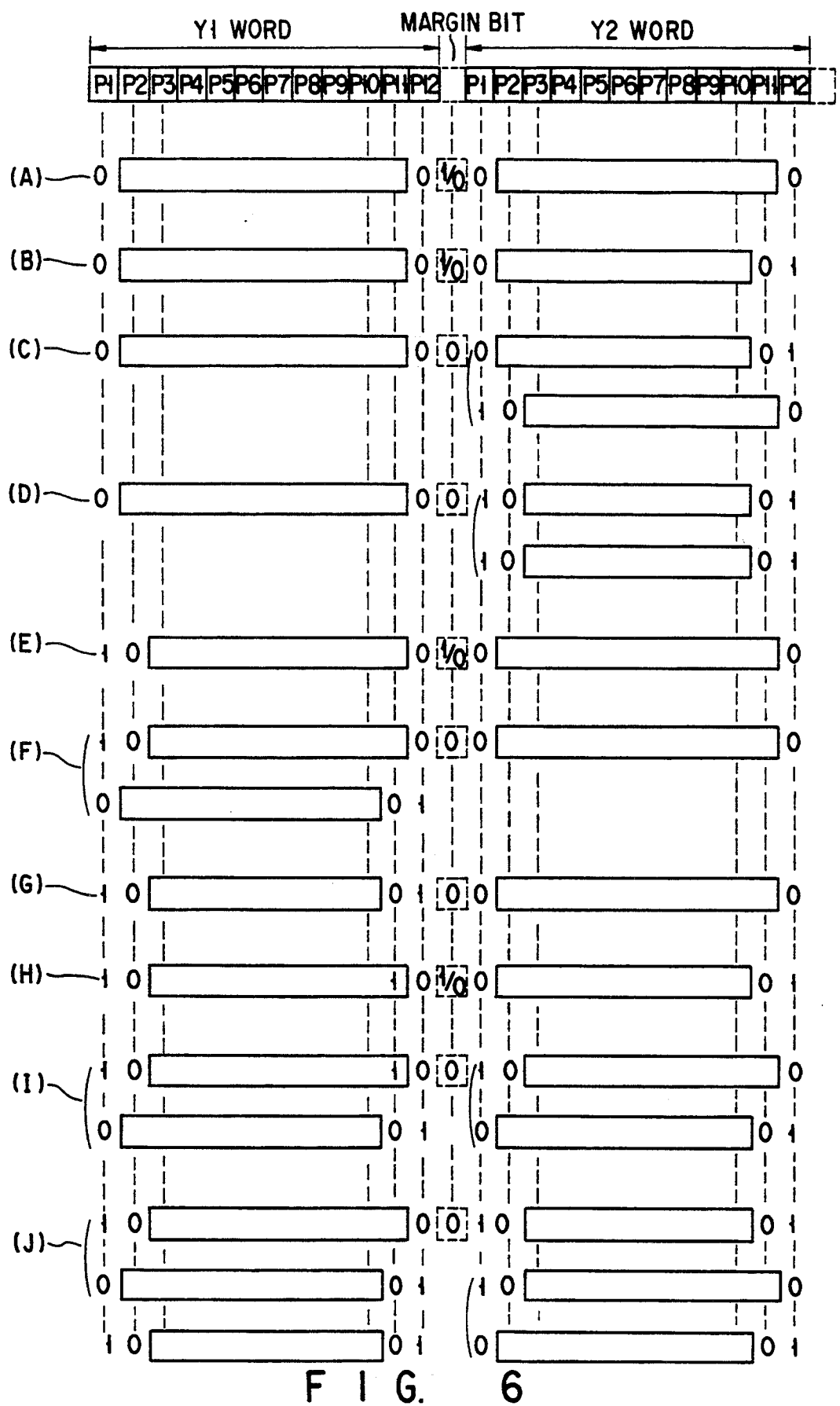
FIG. 6 is a diagram for explaining how a margin bit is used after produced by a margin bit generator shown in FIG. 1.

The actual control operation in each region in FIG. 5 will be described in more details referring to FIGS. 6 through 8. Before going into the description, it is to be noted that parameters are to be set as follows. "a" and "b" indicate absolute values of the CDS values of a code of a Y1 word and a Y2 word shown in FIG. 5; a>0 and b>0. The positive and negative signs that come before those "a" and "b" indicate the polarities of the CDS values, "+" indicating the direction to increase the CDS value and "—" the direction to decrease it. Further, the signs "+" and "—" are determined on the premise that the direction before the initial bit of a code is in the "+" direction. The positive sign that comes after "a" and "b" indicates that the number of change points in a code word, or the number of "1" of an NRZI rule is an even number, and the negative sign indicates the number of change points in the code word is an odd number. In this case, the direction is the opposite to the one before the initial bit of the code word.

The code selector 5 in FIG. 1 selects a code word whose DSV value calculated next by the DSV calculator 7 becomes small with respect to the result of conversion done by the mapping converter 3, and the margin bit generator 6 also in FIG. 1 generates a margin bit to reduce the DSV value and inserts it into an output code word. The principle of the operations of those circuits 5 and 6 will be explained referring to FIGS. 5, 6, 7A, 7B and 8.

FIG. 5 illustrates patterns which two code words, Y1 and Y2, can take. The DSV control operations of the code selector 5 and margin bit generator 6 are executed based on the patterns. The pattern (A) in FIG. 5 is for the case where the Y1 word has P1=P12=0, and the Y2 word has P1=P12=1 and P2=P11=0. In this case the margin bit is fixed to "0" as shown in (D) in FIG. 6. In this case the absolute value of the DSV value can also be reduced using the difference in CDS value of the Y2 word by the same operation as shown in FIG. 7B. The patterns (E) and (F) in FIG. 5 are for the case where the Y1 word has P1=P11=0 and P12=1 or P1=1 and P2=P12=0, and the Y2 word has P1=P12=0. In this case, the absolute value of the DSV value can also be reduced using the margin bit by the same operation as shown in FIG. 7A when P1=1 and P2=P12=0 are selected as shown in (E) in FIG. 6. When "0" is selected for the margin bit and P1=P11=1 and P2=1 or P1=1 and P2=P12=0 are selected for the Y1 word as shown in (F) in FIG. 6, the DSV value varies as shown in FIG. 8 depending on the difference in the CDS value of the Y1 word and the number of change points of a code, so that the code word to reduce the DSV value is selected using this change.

If code words of the same classification, such as +a+ and +@+, which have the same CDS polarity and the same odd number and even number of change points are combined as a combination of two code words of the Y1 word, there may be a pattern in which the DSV value diverges. If code words of different classifications, such as +a+ and —@—, or +a— and —@+, are combined, however, the DSV values of the two words differ from each other. Selecting one of the words can therefore reduce the DSV value. In this example, since +a+ and —@— or +a— and —@+ are combined, either a+b or —(a+b) is selected as the DSV value, or a—b or —(a—b) is selected, making it possible to always reduce the DSV value.

The pattern (G) in FIG. 5 is for the case where the Y1 word has two types of code words having P1=P12=1 and P2=P11=0, and the Y2 word has P1=P12=0. This case is shown in (G) in FIG. 6; the same as can be said to (F) in FIG. 6 is true of this case which has the same operation as shown in FIG. 8. The pattern (H) in FIG. 5 is for the case where the Y1 word has P1=P11=0 and P12=1 or P1=1 and P2=P12=0, and the Y2 word has P1=P11=0 and P12=1 or P1=1 and P2=P12=0. In this case, since "1" or "0" is selectable for the margin bit when P1=1 and P2=P12=0 are selected for the Y1 word and P1=P11=0 and P12=1 are selected for the y2 word, the absolute value of the DSV value can also be reduced by the same operation as shown in FIG. 7B. The pattern (I) in FIG. 5 is for the case where the Y1 word has P1=P11=0 and P12=1 or P1=1 and P2=P12=0, and the Y2 word has P1=P11=0 and P12=1 or P1=1 and P2=0. With the margin bit set to "0," the pattern becomes as shown in (I) in FIG. 6, and the possible operation then is as shown in FIG. 9. In this example, there are four possible DSV values of the Y1 and Y2 words, a+b, a—b, —a+b and —a—b, from which the word that sets the absolute value of the DSV small is to be selected. The pattern (J) in FIG. 5 is for the case where the Y1 word can have P1=P11=0 and P12=1 or P1=1 and P2=P12=0, and the Y2 word can have two types of code words with P1=P12=1 and P2=P11=0, or the case where the Y1 word has P1=P12=1 and P2=P11=0, and the Y2 word can have P1=P11=1 and P12=1, or P1=1 and P2=P12=0, or the case where the Y1 word has P1=P12=1 and P12=P11=0, and the Y2 word can have P1=P12=1 and P2=P11=0. All of those cases are the same as shown in (I) in FIG. 5, and the operation for the cases is the same as shown in FIG. 7B, making it possible to suppress down the absolute value of the DSV value. The structure shown in FIG. 1 can cope with the case where DSV value can be controlled by selecting one of code words converted by the mapping converter 3, and the DSV value can be controlled by inserting the margin bit of "1" or "0" into the selected and output code word.

Figure 10A:
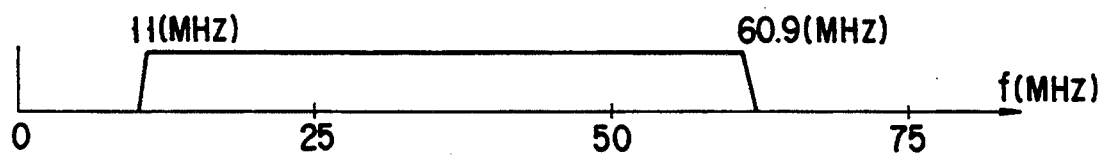
FIGS. 10A and 10B are diagrams showing the frequency bands of a record signal and reproduced signal in the encoding apparatus in FIG. 1 in comparison with the conventional bands.
Figure 10B:
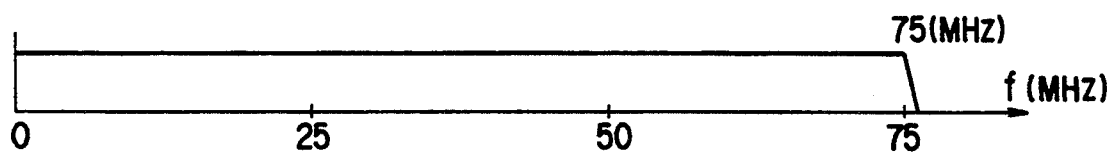

According to this embodiment, input data is assigned to two groups of code words in one-to-one correspondence and one-to-two correspondence by the mapping converter 3 before encoding and one of the code words converted in one-to-two correspondence is selected as a record signal, or a margin bit of "0" or "1" is inserted into the code word output from the mapping converter 3 to reduce the DSV value, thereby preventing the DSV value of the record code word from diverging and making it finite, and reducing its absolute value. Further, since the input data is converted into a 12-bit code word as shown in FIG. 2C by the mapping converter 3, the maximum magnetism inversion time Tmax and minimum magnetism inversion time Tmin become as shown in FIG. 2D; in particular, Tmin=2 Tw (>T). It is also possible to set the maximum magnetism inversion time Tmax to be equal to or smaller than 6.77 T (=11*Tw=11*8/13*T) or equal to or smaller than 8 T at maximum, thus narrowing the low-frequency side band as shown FIG. 10A. Most of the DC component of the record signal and the low frequency component therearound can therefore eliminated to reduce the error rate at the reproducing time, thus improving the image quality. Further, since code words are acquired in the above manner, the density ratio DR (Tmin/T) can be increased by 23% as compared with the prior art. It is therefore possible to reduce the high frequency component of the record signal by that amount as shown in FIG. 10A, narrowing the high-frequency side band of the record signal. Since in general, the characteristic of the recording/reproducing magnetic heads of the VTR section 11 rapidly attenuates in the high frequency range and high frequency component has a large loss, the reduction in the high frequency component of the record signal decreases the error rate, likewise improving the image quality. The required band in this embodiment therefore becomes 11 MHz to 60.9 MHz as shown in FIG. 10A, narrower than that of the conventional system, 0 to 75 MHz, shown in FIG. 10B, thus permitting the recording/reproducing magnetic heads to be used efficiently and in the favorable part of the characteristic to improve the image quality at the recording/reproducing time.

As described above, the encoding apparatus according to the first embodiment can suppress the DSV value down to be finite, so that when used particularly in a magnetic recording/reproducing apparatus, it can contribute to improving the image quality at the recording/reproducing time by reducing the maximum magnetism inversion time and increasing the density ratio.

The second embodiment of the present invention will now be explained referring to the accompanying drawings. FIG. 11 is a block diagram illustrating the embodiment of the present invention as applied to a magnetic recording/reproducing apparatus. Reference numeral "1" denotes an input terminal from which an analog record signal such as a video signal of an HDTV system is input. An A/D converter 2 converts the input analog video signal into an 8-bit digital signal. A mapping converter 3 encodes the 2-word digital signal to a code word constituted of two words consisting of 23 bits in one-to-one correspondence. A margin bit generator 6 generates a margin bit "0" which is to be inserted into the code word sent from the mapping converter 3. A parallel/serial converter 8 converts the code word from the mapping converter 3 into a serial signal and inserts the margin bit output from the margin bit generator 6 into the input code word. A sync signal generator 9 generates a sync signal by which the parallel/serial converter 8 is activated. An NRZI (Non-Return to Zero Inversion) modulator 10 performs NRZI modulation on the serial signal sent from the parallel/serial modulator 8. A VTR section 11 records a record signal input from the NRZI modulator 10 on a magnetic tape T. An NRZI demodulator 12 performs NRZI demodulation on a signal reproduced by the VTR section 11. A sync signal detector 13 detects a sync signal from the demodulated reproduced signal and supplies the sync signal to a serial/parallel converter 14. The serial/parallel converter 14 converts the input serial signal into a parallel signal based on the sync signal. A reverse mapping converter 15 performs reverse mapping on the code word output from the serial/parallel converter 14, and converts that word into a normal digital signal. A D/A converter 16 converts a digital signal into an analog signal. Reference numeral "17" denotes an output terminal where a reproduced analog video signal is output. The mapping converter 3 and the reverse mapping converter 15 perform their conversions in the totally opposite processes.

The operation of this embodiment will now be described. The A/D converter 2 converts a color video signal from the input terminal 1 into a digital signal of 8 bits per pixel. The mapping converter 3 encodes a 2-word input digital signal to a code word constituted of two words consisting of 23 bits in one-to-one correspondence. The minimum number of "0s" between the codes "1," which indicate change points based on an NRZI rule and correspond to magnetism inversion, is one. With one margin bit inserted into the 23-bit code word, the record signal is constituted of two words consisting of 24 bits. If this margin bit is fixed as "0," the code word can be "75250." Since the number of pieces of 2-word input digital data is then $2^{8*2}=65536$, the 2-word input digital data can be coded to the 2-word code word in one-to-one correspondence.

Figure 12:
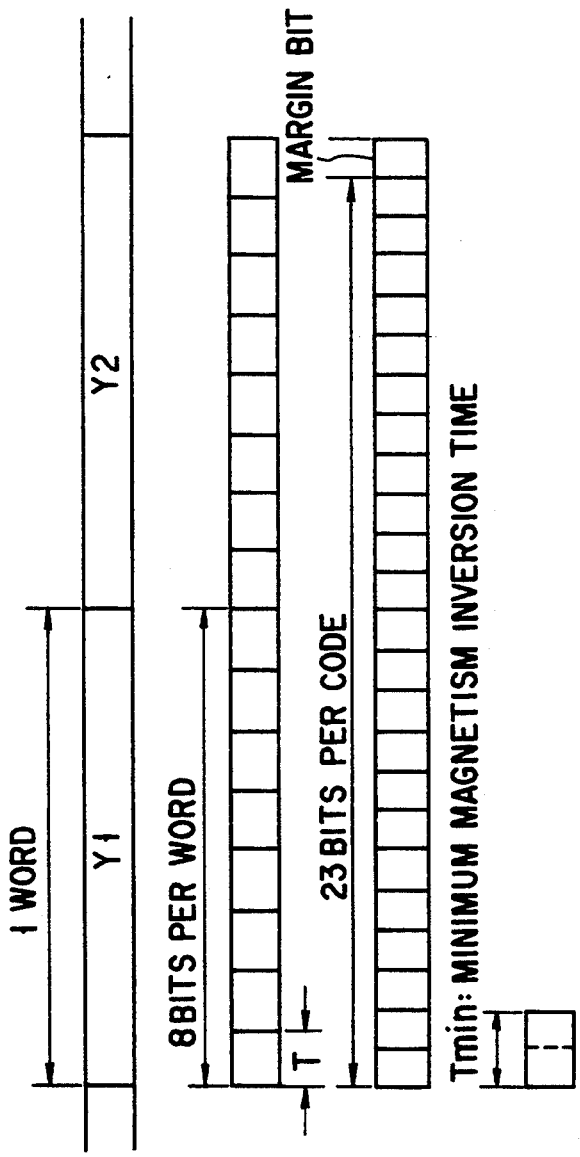
FIGS. 12A to 12D are diagrams exemplifying structures of signals processed in the encoding apparatus shown in FIG. 11.

The color video signal input from the input terminal 1 is converted into an 8-bit digital signal by the A/D converter 2 as shown in FIGS. 12A and 2B, and is sent to the mapping converter 3. The mapping converter 3 encodes the received digital signal constituted of two words consisting of 24 bits into a code word constituted Of two words consisting of 23 bits in one-to-one correspondence as shown in FIG. 12C. The mapping converter then sends the code word to the parallel/serial converter 8. The parallel/serial converter 8 converts the code word received from the mapping converter 3 into a serial signal, and inserts the margin bit "0" produced from the margin bit generator 6 to the serial signal as shown in FIG. 12C, sending the acquired 24-bit signal to the NRZI modulator 10. The NRZI modulator 10 performs NRZI modulation on the received code word, and sends the modulated code word to the VTR section 11. The VTR section 11 records the modulation signal (same as the record signal), sent from the NRZI modulator 10, on the magnetic tape T. Although not explained above, like the first embodiment, an error correction signal, etc. are of course added by a circuit (not shown) to the record signal recorded on the magnetic tape T in the VTR section 11.

A signal reproduced by the VTR section 11, after being demodulated by the NRZI demodulator 12, is sent to the serial/parallel converter 14 and the sync signal detector 13. The sync signal detector 13 detects a sync signal from an input signal, and supplies the sync signal to the serial/parallel converter 14. Upon reception of the sync signal, the serial/parallel converter 14 specifies the position of the code, and converts the input reproduced serial signal into a parallel signal. The 2-word code word reproduced in this manner is input to the reverse mapping converter 15. The reverse mapping converter 15 performs reverse conversion on the received 2-word code word into digital data constituted of two words consisting of 16 bits, and outputs this data to the D/A converter 16. The D/A converter 16 converts the received digital signal into an analog video signal, and sends this video signal to the output terminal 17.

Figure 13:
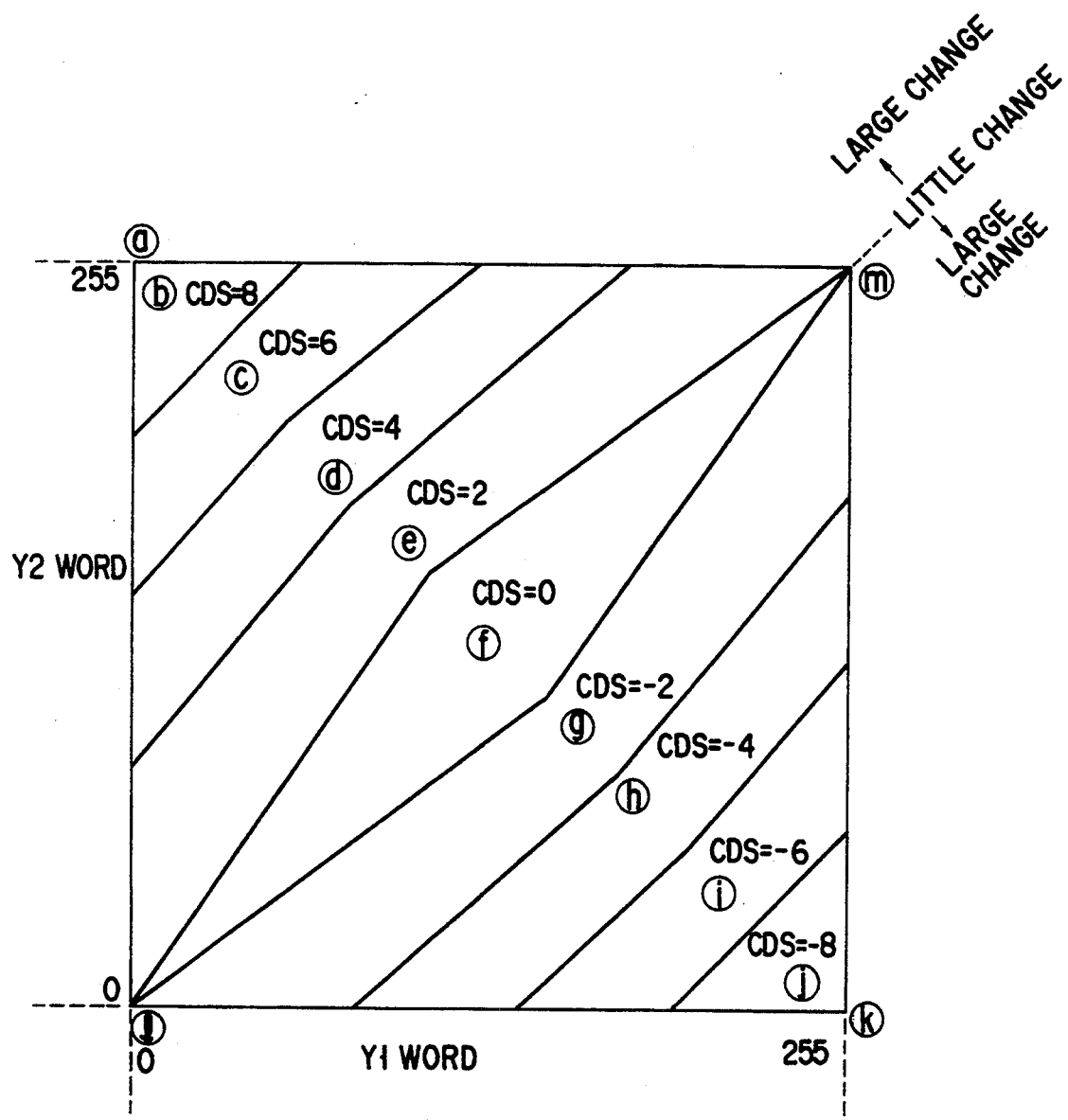
FIG. 13 is an encoding diagram showing the correlations between input data (luminance signal) and code words in a mapping converter shown in FIG. 11.

The detailed operation of the mapping converter according to this embodiment shown in FIG. 11 will be described below. To begin with, the block channel coding system of the mapping converter 3 will be explained referring to FIG. 13. The bottom part of the FIG. 13 indicates the Y1 word of the digital signal input to the mapping converter 3, and the left-hand side the Y2 word. The mapping converter 3 converts the digital signal of two words, Y1 and Y2, in one-to-one correspondence into a code word of two words in a region where it takes the CDS value as shown in FIG. 13. One needs to look at FIG. 13 in such a way that when the value of the Y1 word is relatively close to that of the Y2 word, the Y1 and the Y2 words are converted to 2-word code words with a CDS value of "0" indicated in the region (f), and when the difference between the Y1 and the Y2 words becomes apparent, the Y1 and the Y2 words are converted to 2-word code words with a CDS value of "+2" or "−2" as indicated in the region (e) or the region (g). In this example, it is when the Y1 word is "255" and the Y2 word is "0" that the difference therebetween is the largest. In this case, the Y1 and the Y2 words are converted to 2-word code words in the region (j) where the CDS value is "−8." In other words, the mapping converter 3 converts the input digital data to a code word whose CDS can take any value from −8 to +8. There are 67,567 code words in total in this case, so that the code words can be provided in one-to-one correspondence with respect to the input digital data.

FIGS. 14A and 14B illustrate, in list forms, a specific example where 2-word code words output from the mapping converter 3 including a ROM table are converted into serial data, and a specific example where the former example is further subjected to NRZI modulation. It is shown in this diagram that the leftmost column indicates the digital data Y1 and Y2 which are input to the mapping converter 3, while the next column shows the 2-word code words corresponding to those two pieces of input data. The third column from the left shows the code words after NRZI modulation. The second column from the right shows the CDS values of the associated code words computed in such a way that "+1" and "−1" are given as code weights respectively for "1" and "0" of each code word after NRZI modulation. The rightmost column shows the correlation with the regions (a) to (k) in FIG. 13. It is to be noted that the CDS values are computed with "0" always assigned to the 24-th bit as a margin bit to keep the NRZI rule, and with the initial value of the code after NRZI modulation set to "1." In FIGS. 14A and 14B, for example, the Y1 word having a value of "75" and the Y2 word having a value of "180" correspond to "0000010000000010000000" as a code word. In this case the code word after NRZI modulation is "111110000000000011111111" and the CDS value falls in the region (d) in FIG. 13.

Figure 15:
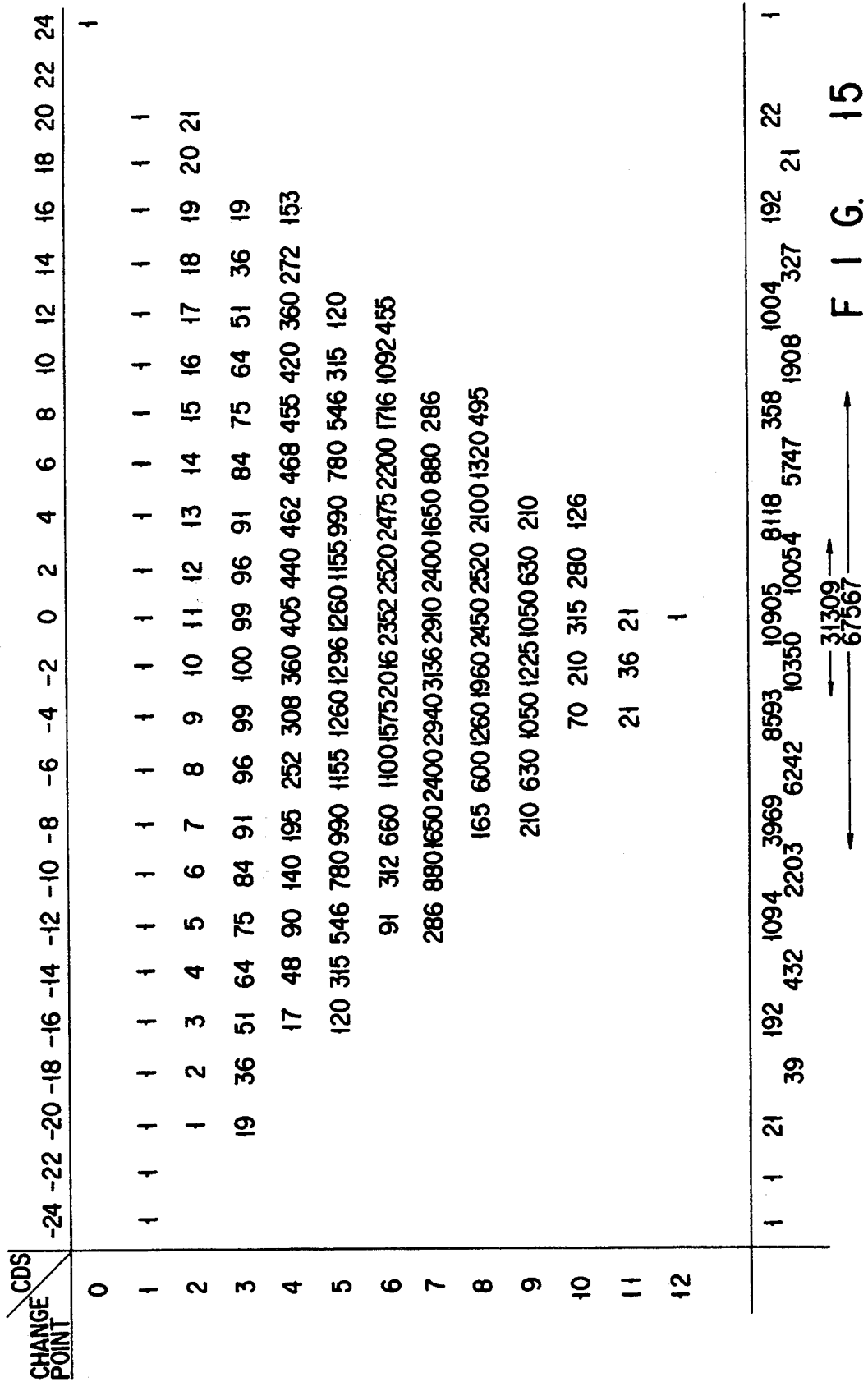
FIG. 15 is a graph showing the CDS value and the number of change points of a code word produced in the encoding apparatus shown in FIG. 11.

FIG. 15 illustrates the relationship between change points of code words each constituted of two words and the respective CDS values. The 24-th bit is set to "0" to satisfy the rule which takes 1 as a minimum number of "0" sandwiched between "1" and "1" of the NRZI rule. For example, this diagram shows that the number of code words having five change points and a CDS value of is "1260." It is apparent from FIG. 15 that there are in total 67,567 codes with CDS values of "−8," "−6," "−4," "−2," "0," "2," "4," "6" and "8" and those codes are associated in one-to-one relation with 2-word input data Y1 and Y2 shown in FIG. 13. There are 10,905 codes with CDS=0. Those codes assigned to the region where there is a little variation between the Y1 and the Y2 words input as shown in FIG. 13. That is, the codes are assigned to the vicinity of the diagonal line of (Y1, Y2)=(0, 0) to (255, 255). Further, the codes with the CDS values "2," "4," "6," "8," "−2," "−4," "−6," and "−8" are assigned to the regions where there are variations between the Y1 and the Y2 words. Since image data has a high correlation, the Y1 and Y2 words take relatively close values, so that the DSV values of the associated code words become "0" as shown in FIG. 13. FIG. 13 illustrates the encoding relation between input data for luminance signals and code words. FIG. 16 shows the encoding relation between input data for color difference signals and code words. Since color difference signals C1 and C2 have low word saturation and are close to the center level of data, the code correlation as shown in FIG. 16 is possible.

According to this embodiment, in encoding a 16-bit 2-word digital signal to a 23-bit 2-word code word and then converting it to serial data, a margin bit of "0" is inserted in the code word to prepare a record signal, and this record signal is recorded on the VTR section 11 or reproduced therefrom. This can provide the following relationship between the minimum magnetism inversion time Tmin and the data clock T as shown in FIG. 12D. Because of the relationship of Tmin=8 T * 2/12=4 T/3, the density ratio DR can be set to DR=Tmin/T>1, which is greater than the one set in the prior art, thus suppressing the high frequency component included in the record signal. The frequency band of the signal recorded on or reproduced from the VTR section 11 in this embodiment becomes as high as 75 MHz as shown in FIG. 17A, narrowed down to 75% of 100 MHz (prior art case). In consideration that, in general, the recording/reproducing characteristic of the magnetic head system of the VTR section 11 rapidly attenuates in the high frequency range, the elimination of the mentioned high frequency component will reduce the error rate at the recording/reproducing time to thereby improve the image quality. With regard to the low frequency component of the record signal, it is suppressed at that portion of the record signal which has a correlation, as in the prior art case. FIGS. 17A and 17B illustrate record signal bands corresponding to the bands needed for converting input data of 200 Mbps to code words. Although this embodiment has been described with reference to the case where two words of 8-bit input data are converted to a 23-bit 2-word code word, generally speaking, the same advantages can be obtained if input data consisting of i * m bits is converted to an n-bit code word where m is the number of bits of each piece of input data, i is the number of combining words, and n is the number of bits of a code.

As described above, the encoding apparatus according to the second embodiment can suppress the high frequency component of a record signal/reproduce signal by increasing the density ratio, so that when used particularly in a magnetic recording/reproducing apparatus, it can contribute to improving the image quality at the recording/reproducing time.

The third embodiment of the present invention will now be described; however, since its structure and operation are almost the same as the those of the second embodiment, only the different portions will be described below.

In this case, the relationship between the number of change points in the aforementioned 23-bit 2-word code word and the number of code words having the change points in the conversion executed in a mapping converter 3 (refer to FIG. 11 hereinafter) is as shown in FIG. 18, and the 24-th bit is set to "0" to satisfy the coding rule, e.g. the rule which takes 1 as a minimum number of "0" sandwiched between "1" and "1" of the NRZI rule, as described earlier.

The detailed operation of the mapping converter according to this embodiment will now be explained. The mapping converter 3 in this embodiment converts the aforementioned input 2-word digital signal to a 2-word code word in one-to-one correspondence, based on the correlation diagram in FIG. 19 which illustrates the one-to-one correlation between an input digital signal and code words. In FIG. 19, the X axis indicates the level of an Y1 word of the digital signal input to the mapping converter 3, and the Y axis the level of an Y2 word of the succeeding input digital signal. The vicinity of the diagonal line connecting the X- and Y-coordinates (0, 0) and (255, 255) represent a code word region where there is a little variation between the Y1 and the Y2 words. The regions around the coordinates (0, 255) and (255, 0) are where there is a large variation between the Y1 and the Y2 words. That is, in FIG. 19, the code words which increase the product of the spectrum of the code word and the C/N ratio representing the characteristic of the transfer path of the VTR section 11 are arranged in the proximity of the diagonal line, and the code words which decrease the product of the spectrum and the C/N ratio are arranged in the region above that proximity toward the coordinates (0, 255) and the region therebelow toward the coordinates (255, 0).

A description will now be given of the product of the spectrum of the code word and the C/N ratio representing the characteristic of the transfer path. FIGS. 20 through 22 illustrate the relationships between the code words and their spectra. FIG. 20 shows the relationship in the case where the duty ratio of the waveform of the code word is 50%, and FIGS. 21 and 22 show the relationships in the case where the duty ratio is not 50%. To compute the product of the spectrum of a code word with a duty ratio of 50% and the C/N ratio, the product of a single spectrum and the C/N ratio needs to be calculated. For a code word with a duty ratio other than 50%, however, the products of a plurality of spectra and the C/N ratio should be acquired and then summed up, and the code word corresponding to the input data should then be rearranged as shown in FIG. 19, based on the sum. The following description is for the case where the duty ratio of the code word is 50%.

The horizontal axis f of the frequency spectrum in FIGS. 20 to 22 represents the normalized frequency values.

In this embodiment, a 2-word input digital signal is converted to a 24-bit code. The values on the horizontal axis f are given, taking the frequency when the code is inverted bit by bit as "1." Since the number of successive bits of the same binary value is assumed to be 2 or greater in the description of this embodiment, the code having the maximum frequency with the duty ratio of 50% is the one having twelve change points, (12) in FIG. 20. In this case the spectrum is present at the position of the normalized value, 0.5.

Figure 23A:
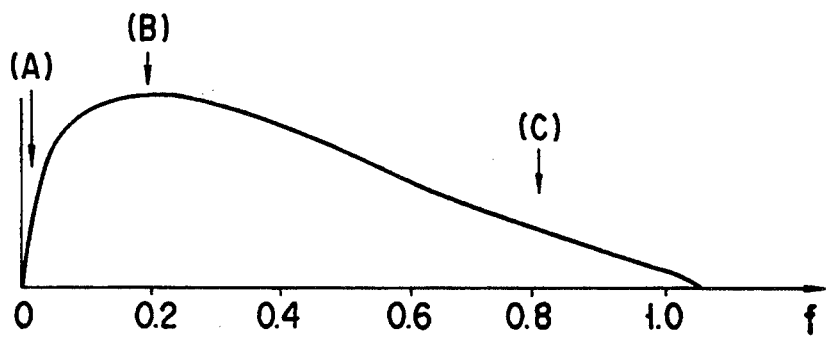
Figure 23B:
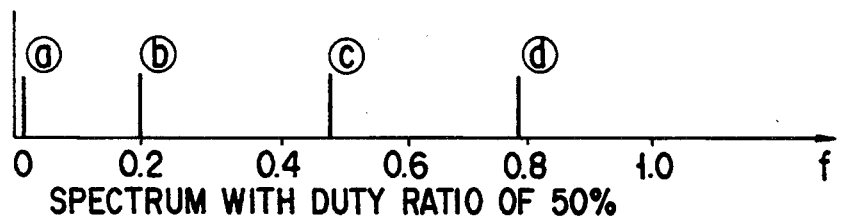
Figure 23C:
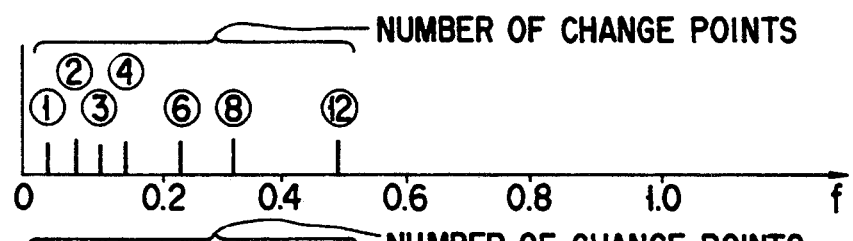
Figure 23D:
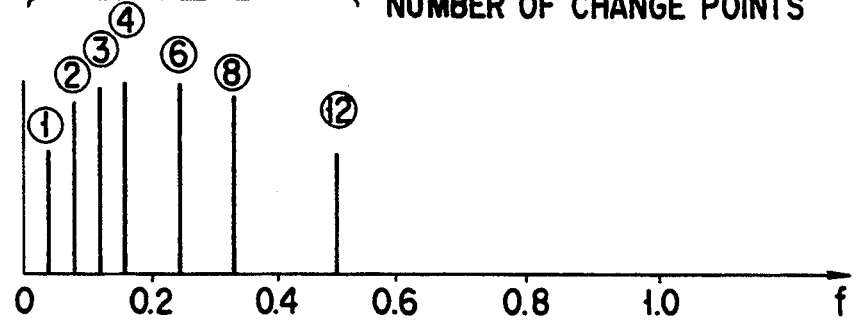

Taking the product of the characteristic (C/N ratio) of the tape head system of the VTR section 11, as shown in FIG. 23A, and the spectrum of a code word as shown in FIG. 23C results in the spectrum-CN product (which may hereinafter be simply called "C/N product) as shown in FIG. 23D. The numerals indicated by ①  to 12 in FIGS. 23C and 23D represent the number of change points of code words. The necessary spectrum for a code word with a duty ratio of 50% is a single spectrum shown in FIG. 20, which the same amplitude for code words, so that the energy of code words is the same irrespective of the number of the change points as shown in FIG. 23C. The C/N product is therefore determined by the characteristic of the tape head system shown in FIG. 23A, and becomes as shown in FIG. 23D. The code words corresponding to the Y1 word and Y2 word are rearranged in such a way that the C/N products acquired for the individual code words in the above manner are distributed as shown in FIG. 19.

FIGS. 24A and 24B illustrate, in list forms, a specific example of code words corresponding to the Y1 and Y2 words in FIG. 4, in which case 2-word code words output from the mapping converter 3 are converted into serial data. It is shown in this diagram that the leftmost column indicates the digital data Y1 and Y2 which are input to the mapping converter 3, while the next column shows the 2-word code words corresponding to those two pieces of input data as codes based on the NRZI rule. The third column from the left shows the code words after NRZI modulation. The second column from the right shows the spectra of the corresponding code words classified by the number of change points (1) to (12) so as to be associated with the spectrum shown in FIG. 20. The rightmost column shows the correlation with the regions (1) to (12) in FIG. 19. In FIGS. 24A and 24B, for example, the code word corresponding to the Y1 word having a value of "75" and the Y2 word having a value of "180" is "100000001000000010000000." In this case the code word after NRZI modulation is "000000001111111100000000" and the spectrum of this code word corresponds to the spectrum for the number of change points (3) in FIG. 20, and is located in the region (3) in FIG. 19.

The magnetic recording/reproducing characteristic of the VTR section 11 generally has a low C/N ratio in the low-frequency range and high-frequency range. Since there is a spectrum for a low frequency component when (Y2−Y1) indicating the change between the Y1 and the Y2 words in FIG. 19 is positive, any code word in the region (1) in FIG. 19 is associated with the Y1 and the Y2 words. Since there is a spectrum for a high frequency component when (Y2−Y1) is negative, any code word in the region (12) in FIG. 19 is associated with the Y1 and the Y2 words. The code words in the encoding diagram of FIG. 19 are arranged in the above manner. In short, input digital data is converted to code words by assigning the input digital data to code words having a low-frequency side spectrum when (Y2−Y1)>0, to code words having a spectrum for a frequency component having a good C/N ratio when (Y2−Y1) is in the vicinity of 0, and to code words having a high-frequency side spectrum when (Y2−Y1)<0 in the mapping converter 3. FIG. 19 shows the encoding relation between input data (luminance signal) and code words. FIG. 25 shows the encoding relation between input data for color difference signals and code words. Since color difference signals C1 and C2 have low word saturation and are close to the center level of data, the code correlation as shown in FIG. 25 is possible.

According to this embodiment, since a color video signal input from the input terminal 1 in FIG. 11 has a high correlation, the Y1 and the Y2 words take relatively close values. If the Y1 and the Y2 words are associated with code words based on the encoding diagram of FIG. 19, therefore, most of the input video signal can be converted to code words in the regions (4) to (6). This can increase the probability of occurrence of code words which allow for the use of the portion of the characteristic of the VTR section 11 that has a good C/N ratio. The spectrum of a code word to be recorded on the VTR section 11 can therefore be set to the one as shown in FIG. 26B. In addition, since the characteristic of this spectrum nearly matches the frequency response of the transfer path portion of the VTR section 11 shown in FIG. 26A, the spectrum of the signal to be recorded on or reproduced from a magnetic tape by the VTR section 11 of this embodiment can be distributed mostly in that portion of the transfer path which has the best C/N ratio. This can significantly reduce the error rate of that signal, thereby improving the quality of the recorded/reproduced image.

FIG. 26C shows the spectrum distribution for an NRZ code word according to the prior art, and FIG. 26D the spectrum distribution for an 8-14 encoded code word according to the prior art. In the former prior art, since the spectrum is distribute widely from the lowfrequency range to the high-frequency range, the error rate becomes large accordingly. In the latter case, since the spectrum is present in the high-frequency range of the transfer path which has a low C/N ratio although the frequency band is narrower than that of NRZ coding, unlike in the case of the spectrum distribution of the code words in this embodiment, the best use of the characteristic of the transfer path is not possible, increasing the error rate accordingly. Although this embodiment has been described with reference to the case where two words of 8-bit input data are converted to a 23-bit 2-word code word, in general, the same advantages can be obtained if input data consisting of i*m bits is converted to an n-bit code word where m is the number of bits of each piece of input data, i is the number of combining words, and n is the number of bits of a code.

As described above, the encoding apparatus according to the third embodiment can permit the spectrum of an encoded image signal to concentrate on that portion of a transfer path having a good C/N ratio, so that when used particularly in a magnetic recording/reproducing apparatus, it can considerably improve the error rate at the recording/reproducing time to thereby contribute to improving the image quality at the recording/reproducing time.

According to the first aspect of the present invention, a magnetic recording/reproducing apparatus encodes an m-bit digital signal to a code word which is recorded on/reproduced from a magnetic tape. The magnetic recording/reproducing apparatus comprises encoding means for encoding the m-bit digital signal to an n-bit code word in one-to-one correspondence or in one-to-two correspondence, DSV calculating means for calculating the DSV value of the code words output from the encoding means, CDS calculating means for calculating the CDS values for all the code words encoded by the encoding means, code selecting means for selecting one of the two code words corresponding to one piece of input data so that the next accumulated DSV value to be calculated by the DSV calculating means will be decreased based on the DSV value calculated by the DSV calculating means and the CDS value calculated by the CDS calculating means, and margin bit inserting means for generating a margin bit and inserting it into the code word output from the encoding means so that the next DSV value to be calculated by the DSV calculating means will be decreased based on the DSV value from the DSV calculating means and the CDS value from the CDS calculating means, whereby the code word output from the encoding means is recorded on a magnetic tape.

In the magnetic recording/reproducing apparatus according to the first aspect of the present invention, the encoding means encodes the m-bit digital signal to an n-bit code word in one-to-one correspondence or in one-to-two correspondence. The DSV calculating means calculates the DSV value of the code word output from the encoding means. The CDS calculating means calculates the CDS values for all the code words encoded by the encoding means. The code selecting means selects one of the two code words corresponding to one piece of input data so that the next DSV value to be calculated by the DSV calculating means will be decreased based on the DSV value calculated by the DSV calculating means and the CDS value calculated by the CDS calculating means. The margin bit inserting means generates a margin bit and inserting it into the code word output from the encoding means so that the next DSV value to be calculated by the DSV calculating means will be decreased based on the DSV value from the DSV calculating means and the CDS value from the CDS calculating means. The code word output from the encoding means is recorded on a magnetic tape.

According to the second aspect of the present invention, a magnetic recording/reproducing apparatus, which converts an input signal into a digital signal and encodes the digital signal to a code word that is in turn recorded on or reproduced from a magnetic tape, comprises encoding means for encoding i words of a digital signal consisting of m bits per word to a n-bit code word in one-to-one correspondence and assigning that signal of said code word corresponding to said i-word digital signal which has a small variation per word to that region whose absolute value of the CDS value is small to execute encoding, and margin bit inserting means for inserting a predetermined margin bit in the n-bit code word output from the encoding means, whereby the code word, which is encoded and output by the encoding means, is recorded on the magnetic tape.

In the magnetic recording/reproducing apparatus according to the second aspect of the present invention, the encoding means encodes i words of a digital signal consisting of m bits per word to a n-bit code word in one-to-one correspondence, and assigns that signal of said code word corresponding to said i-word digital signal which has a small variation per word to that region whose absolute value of the CDS value is small to execute encoding. The margin bit inserting means inserts a predetermined margin bit in the n-bit code word output from the encoding means. The code word, which is encoded and output by the encoding means, is recorded on the magnetic tape.

According to the third aspect of the present invention, a magnetic recording/reproducing apparatus, for converting an input signal into a digital signal data and encoding the digital signal to a code word which is in turn recorded on or reproduced from a magnetic tape, comprises encoding means for encoding i words of the digital signal consisting of m bits per word to a n-bit code word in one-to-one correspondence so that the code word, which provides a large product of its spectrum and the C/N of the transfer path in the magnetic recording/reproducing apparatus, is assigned to the frequently input i-word digital signal, whereby the code word output from the encoding means is recorded on the magnetic tape.

In the magnetic recording/reproducing apparatus according to the third aspect of the present invention, the encoding means encodes i words of a digital signal consisting of m bits per word to an n-bit code word in one-to-one correspondence so that the code word, which provides a large product of its spectrum and the C/N of the transfer path in the magnetic recording/reproducing apparatus, is assigned to a frequently input i-word digital signal. The code word output from the encoding means is recorded on a magnetic tape.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. An encoding apparatus comprising:
    encoding means for separating an input digital signal including m bits (m: a positive integer) into a first group and a second group predetermined with respect to $2^m$ pieces of data allowable for said input digital signal, and encoding each piece of data in said first group to a single code word including n bits (n being a positive integer and larger than m) in one-to-one correspondence and encoding each piece of data in said second group to two code words each including n bits in one-to-two correspondence;
    CDS (Code word Digital Sum) calculating means for calculating a CDS value for each of said words output from said encoding means;
    DSV (Digital Sum Variation) calculating means for calculating an accumulated DSV value of said individual words output from said encoding means;
    code selecting means for, when said two-n-bit code words are output from said encoding means, selecting that one of said code words which decreases a next accumulated DSV value to be calculated by said DSV calculating means, in accordance with said CDS value from said CDS calculating means and said accumulated DSV value from said DSV calculating means;
    margin bit inserting means for generating a predetermined margin bit which decreases a next accumulated DSV value to be calculated by said DSV calculating means, in accordance with said CDS value from said CDS calculating means and said accumulated DSV value from said DSV calculating means, and inserting said margin bit in said single n-bit code word output from said encoding means and said one code word selected by said code selecting means; and
    transfer means for transferring an encoded code word including a total of n+1 bits resulting from the insertion of said predetermined margin bit by said margin bit inserting means.

2. An encoding apparatus according to claim 1, wherein said m is 8 and said n is 12.

3. An encoding apparatus according to claim 2, wherein said encoding means includes means for encoding data "0" to "140" as said first group, out of "0" to "255" which said input digital signal can have, and encoding data "141" to "255" as said second group.

4. An encoding apparatus comprising:
    encoding means for encoding an input digital video signal including m bits (m: a positive integer) per word to a code word including n bits with the number of consecutive bits of a same binary value after NRZI-modulating, being defined to be 2 or greater for every i words (i being a positive integer equal to or greater than 2) having a mutual correlation (n being an integer and n>m*i), in one-to-one correspondence, said encoding means classifying in advance said input video signal into a plurality of regions according to a CDS (Cord word Digital Sum) value of each of $2^{m*i}$ pieces of data allowable for said n-bit code word and assigning that signal of said code word corresponding to said i-word digital signal which has a small variation per word to that region whose absolute value of the CDS value is small to execute encoding;
    margin bit inserting means for inserting a predetermined margin bit in said n-bit code word output from said encoding means; and
    transfer means for transferring an encoded code word including a total of n+1 bits resulting from the insertion of said predetermined margin bit by said margin bit inserting means.

5. An encoding apparatus according to claim 4, wherein said m is 8, said i is 2 and said n is 23.

6. An encoding apparatus according to claim 5, wherein said plurality of regions include nine regions where said CDS values correspond to 0, ±2, ∓4, ±6 and ±8.

7. An encoding apparatus for encoding an input digital video signal including m bits (m being a positive integer) per word to a predetermined serial data and transferring said code word to a predetermined transfer path, comprising:

encoding means for encoding said digital video signal including m bits per word to a code word consisting of n bits with the number of consecutive bits of a same binary value being defined to be 2 or greater for every i words (i being a positive integer equal to or greater than 2) having a mutual correlation (n being a positive integer and $n > m*i$), in one-to-one correspondence, said encoding means classifying in advance said input digital video signal into a plurality of regions according to a product of a spectrum of each of $2^{m*i}$ pieces of data allowable for said n-bit code word and a C/N (carrier-to-noise) ratio and assigning that signal of said code word corresponding to said i-word digital signal which has a small variation per word to that region for which a product of said spectrum and said C/N ratio is large to execute encoding; and transfer means for transferring on said predetermined transfer path an encoded code word encoded by said encoding means.

8. An encoding apparatus according to claim 7, further comprising:

margin bit inserting means for inserting a predetermined margin bit in said n-bit code word output from said encoding means, when the number of consecutive bits of a same binary value is defined 2 or greater to the code word of n bits, and wherein said transfer means transfers on said predetermined transfer path an encoded code word including a total of $n+1$ bits resulting from the insertion of said predetermined margin bit by said margin bit inserting means.

9. An encoding apparatus according to claim 8, wherein said m is 8, said i is 2 and said n is 23.

10. An encoding apparatus according to claim 9, wherein said plurality of regions include nine regions.

* * * * *